US010937928B2

(12) United States Patent
Yokoyama et al.

(10) Patent No.: US 10,937,928 B2
(45) Date of Patent: Mar. 2, 2021

(54) NITRIDE SEMICONDUCTOR ELEMENT, NITRIDE SEMICONDUCTOR LIGHT EMITTING ELEMENT, ULTRAVIOLET LIGHT EMITTING ELEMENT

(71) Applicant: ASAHI KASEI KABUSHIKI KAISHA, Tokyo (JP)

(72) Inventors: Aya Yokoyama, Tokyo (JP); Yoshihito Hagihara, Tokyo (JP); Ryosuke Hasegawa, Tokyo (JP); Akira Yoshikawa, Tokyo (JP); Ziyi Zhang, Tokyo (JP); Tomohiro Morishita, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/184,237

(22) Filed: Nov. 8, 2018

(65) Prior Publication Data

US 2019/0140141 A1    May 9, 2019

(30) Foreign Application Priority Data

Nov. 9, 2017   (JP) .............................. JP2017-216599
Dec. 18, 2017  (JP) .............................. JP2017-241823
Nov. 8, 2018   (JP) .............................. JP2018-210729

(51) Int. Cl.
*H01L 33/32*     (2010.01)
*H01L 33/40*     (2010.01)
(Continued)

(52) U.S. Cl.
CPC ............ *H01L 33/325* (2013.01); *H01L 33/06* (2013.01); *H01L 33/32* (2013.01); *H01L 33/40* (2013.01);
(Continued)

(58) Field of Classification Search
CPC ... H01L 33/38; H01L 33/405; H01L 33/0075; H01L 33/40–405; H01L 33/385; H01L 33/387; H01L 2933/0015
See application file for complete search history.

(56) References Cited

U.S. PATENT DOCUMENTS 6,380,564 B1 *   4/2002   Chen ...................... H01L 33/38
                                                    257/94
6,590,919 B1 *   7/2003   Ueta ................... H01S 5/32341
                                                    372/46.01
(Continued)

FOREIGN PATENT DOCUMENTS

JP    2003110140 A  *  4/2003
JP    2013-102192 A     5/2013
(Continued)

OTHER PUBLICATIONS

JP-2003110140-A—machine translation (Year: 2003).*

*Primary Examiner* — Vincent Wall
(74) *Attorney, Agent, or Firm* — Morgan, Lewis & Bockius LLP

(57) ABSTRACT

To provide a nitride semiconductor element having a better contact resistance reduction effect also in the case of a light emitting element containing AlGaN having a high Al composition. The nitride semiconductor element has a substrate 1, a first conductivity type first nitride semiconductor layer 2 formed on the substrate 1, and a first electrode layer 4 formed on the first nitride semiconductor layer 2. The first electrode layer 4 contains aluminum and nickel, and both aluminum and an alloy containing aluminum and nickel are present in a contact surface to the first nitride semiconductor layer 2 or in the vicinity of the contact surface.

30 Claims, 10 Drawing Sheets

(51) Int. Cl.
*H01L 33/06* (2010.01)
*H01L 33/20* (2010.01)

(52) U.S. Cl.
CPC ...... *H01L 33/20* (2013.01); *H01L 2933/0016* (2013.01)

(56) References Cited

U.S. PATENT DOCUMENTS

| | | | | |
|---|---|---|---|---|
| 9,466,765 | B1* | 10/2016 | Yoon | H01L 33/0075 |
| 10,134,956 | B2* | 11/2018 | You | H01L 33/405 |
| 2002/0030196 | A1* | 3/2002 | Iwata | H01S 5/327 |
| | | | | 257/102 |
| 2003/0006422 | A1* | 1/2003 | Miki | H01L 33/42 |
| | | | | 257/99 |
| 2003/0127658 | A1* | 7/2003 | Sheu | B82Y 20/00 |
| | | | | 257/79 |
| 2005/0167680 | A1* | 8/2005 | Shei | H01L 25/167 |
| | | | | 257/79 |
| 2005/0224812 | A1* | 10/2005 | Liu | H01L 33/40 |
| | | | | 257/79 |
| 2006/0145174 | A1* | 7/2006 | Lee | H01L 33/46 |
| | | | | 257/98 |
| 2009/0127539 | A1* | 5/2009 | Shakuda | H01L 33/20 |
| | | | | 257/13 |
| 2010/0051994 | A1* | 3/2010 | Katsuno | H01L 33/387 |
| | | | | 257/98 |
| 2010/0219395 | A1 | 9/2010 | Hirayama et al. | |
| 2013/0146920 | A1* | 6/2013 | Hong | H01L 33/38 |
| | | | | 257/98 |
| 2014/0001508 | A1* | 1/2014 | Tasaki | H01L 33/40 |
| | | | | 257/98 |
| 2014/0021442 | A1 | 1/2014 | Inazu et al. | |
| 2016/0043280 | A1* | 2/2016 | Moon | H01L 33/44 |
| | | | | 257/97 |
| 2016/0218243 | A1* | 7/2016 | Jung | H01L 33/30 |
| 2017/0084779 | A1* | 3/2017 | Moe | H01L 33/145 |
| 2018/0145224 | A1* | 5/2018 | Kim | H01L 33/46 |
| 2018/0366613 | A1* | 12/2018 | Jang | H01L 33/48 |

FOREIGN PATENT DOCUMENTS

| | | |
|---|---|---|
| JP | 5641173 B2 | 11/2014 |
| JP | 2017-112313 A | 6/2017 |
| WO | 2012/144046 A1 | 10/2012 |

* cited by examiner

NITRIDE SEMICONDUCTOR ELEMENT, NITRIDE SEMICONDUCTOR LIGHT EMITTING ELEMENT, ULTRAVIOLET LIGHT EMITTING ELEMENT

BACKGROUND OF THE INVENTION

Field of the Invention

The present invention relates to a nitride semiconductor element.

Description of the Related Art

Nitride semiconductors, such as AlN, GaN, InN, and AlGaN, are attractive materials capable of variously changing the energy band gap by changing the composition ratio of Group III elements (Al, Ga, In).

In particular, AlGaN has been used for various devices, such as deep UV sensors/light emitting diodes and AlGaN/GaN power devices and transistors. However, AlGaN having a high Al composition is well known as difficult to form an ohmic contact with electrode materials, and thus causing an increase in resistance of AlGaN/electrode interface. Moreover, an electrode contains several metal materials and necessary to be annealed in order to make good contact with AlGaN, and therefore alloys can be formed during the annealing process. When the resistance of the formed alloys is high, the bulk resistance of the electrode increases in some cases. Herein, the sum of the resistance of the AlGaN/electrode interface and the bulk resistance of the electrode is defined as a contact resistance.

When AlGaN is used as a material of a light emitting element, a forward voltage of the light emitting element increases when the contact resistance increases, and therefore the heat generation increases, so that the optical power output decreases and/or the lifetime becomes shorter. Therefore, it is important for the light emitting element containing AlGaN having a high Al composition to lower the contact resistance. By reducing the contact resistance, the forward voltage can be reduced.

As a method for reducing the contact resistance of the light emitting element containing AlGaN having a high Al composition, a method described in PTL 1 is mentioned, for example. According to this method, Ti/Al/Ti/Au layers, for example, are vapor-deposited as metal layers for electrodes with film thicknesses of 20 nm/100 nm/50 nm/100 nm, respectively, on an n-type $Al_xGa_{(1-x)}N$ layer, and then rapid thermal annealing treatment is performed to thereby form an electrode. Here, the annealing temperature is set to an appropriate temperature according to the Al composition of the n-type $Al_xGa_{(1-x)}N$ layer, whereby the contact resistance is reduced. More specifically, the annealing temperature is set so that the contact resistance is the lowest depending on the Al composition of the n-type $Al_xGa_{(1-x)}N$ layer.

CITATION LIST

Patent Literature

PTL 1: WO 2012/144046

SUMMARY OF THE INVENTION

According to the method described in PTL 1, a contact resistance is reduced but insufficient, and thus further reduction of the contact resistance is necessary.

It is an object of the present invention to provide a nitride semiconductor element which has low contact resistance even though Al composition of AlGaN is high. Here, the nitride semiconductor element includes light emitting elements and other devices.

To achieve the object, a first aspect of the present invention provides a nitride semiconductor element having the following configurations (1) to (3).

(1) A substrate, a first conductivity type first nitride semiconductor layer formed on the substrate, and a first electrode layer formed on the first nitride semiconductor layer are included.

(2) The first electrode layer contains aluminum and nickel.

(3) In a contact surface to the first nitride semiconductor layer of the first electrode layer or in the vicinity of the contact surface, at least both aluminum and an alloy containing aluminum and nickel are present.

According to the nitride semiconductor element of the present invention, low contact resistance can be achieved even when high Al composition of AlGaN is used.

DESCRIPTION OF THE PREFERRED EMBODIMENTS

[Nitride Semiconductor Element of First Aspect]

Figure 1:
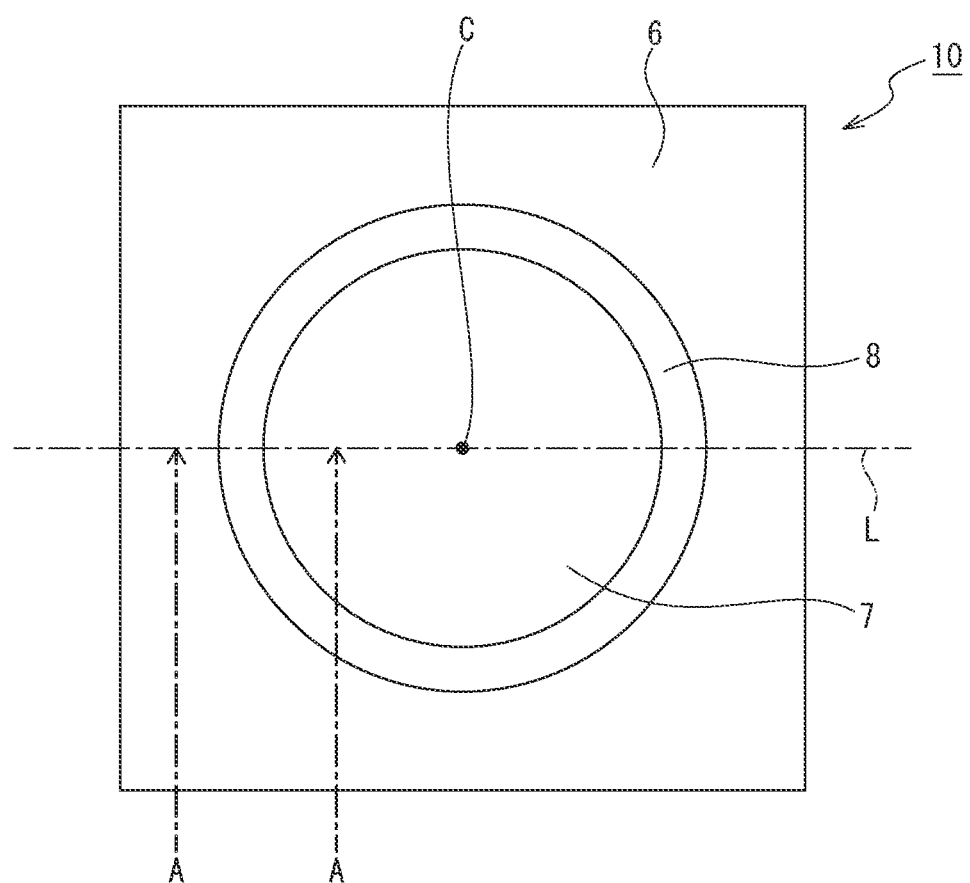
FIG. 1 is a plan view illustrating a nitride semiconductor element of a first embodiment.

In a nitride semiconductor element of a first aspect having configurations from (1) to (3), one or more elements selected from Ti, Mo, V, Au, W, Pt, Pd, Si, and Zr can be present or Ti or Au can be present in at least a part of the contact surface or in the vicinity of the contact surface. Moreover, in the nitride semiconductor element of the first aspect, Ti can be present in at least a part of the contact surface or in the vicinity of the contact surface.

The nitride semiconductor element of the first aspect having configurations from (1) to (3) and above mentioned preferably has the following configurations (4) and (5).

(4) The total existence area ratio of the aluminum and the alloy containing aluminum and nickel on the contact surface or in the vicinity of the contact surface is 60% or more, or 70% or more.

(5) The contact surface or in the vicinity of the contact surface has a first region having the alloy layer containing aluminum and nickel on the first nitride semiconductor layer side and a second region having an aluminum containing layer other than the alloy layer on the first nitride semiconductor layer side, in which the ratio of the area of the second region to the total area of the first region and the second region is 30% or more.

When intermediate layers are present between the alloy layer and the first nitride semiconductor layer and/or between the aluminum containing layer and the first nitride semiconductor layer, the undersurfaces of the alloy layers and/or the aluminum containing layers do not become the contact surfaces to the first nitride semiconductor layer.

In this case, the total existence area ratio of (4) is not the existence area ratio in the contact surface but the existence area ratio in the vicinity of the contact surface and is the existence area ratio in the contact surface when the alloy layer and the aluminum containing layer contact to the first nitride semiconductor layer.

The vicinity of the contact surface is a portion close to the first nitride semiconductor layer in the first electrode layer but not contacting to the first nitride semiconductor layer and means a portion closer to the contact surface than a position 3 nm separated from the contact surface within the first electrode layer, for example. Specifically, a predetermined cross section which is perpendicular to a substrate and containing the first electrode layer of the nitride semiconductor element is cut out with 100 nm or less of thickness parallel to the cross section surface by an FIB (Focused Ion Beam) method using 30 kV Ga$^+$, for example. Then, the height from the surface of the first nitride semiconductor layer is measured from a BF (Bright Field) image or a HAADF (High Angle Annular Dark Field) image obtained by observing the cross section at an acceleration voltage of 200 kV by a STEM (Scanning Transmission Electron Microscope). A region having the height of 3 nm or less is defined as the vicinity of the contact surface.

The vicinity of the contact surface means the surface in the first electrode layer parallel to the contact surface and the surface in a region between a surface 3 nm separated from the contact surface and the contact surface.

The nitride semiconductor element of the first aspect having configurations from (1) to (5) may preferably include the following configurations from (6) to (8).

(6) The thickness of the aluminum containing layer can be set to 1 nm or more and 150 nm or less or 1 nm or more and 100 nm or less.

(7) The thickness of the alloy layer can be set to 100 nm or more and 1000 nm or less or 100 nm or more and 600 nm or less.

(8) In the cross section perpendicular to the substrate and along a straight line passing through the center of the substrate and extending from one end to the other end of the substrate as viewed in plan, the area ratio of the alloy layer to the aluminum containing layer satisfies Alloy layer: Aluminum containing layer=1:2 to 400:1 or Alloy layer: Aluminum containing layer=2:35 to 400:1

In the nitride semiconductor element of the first aspect, the first nitride semiconductor layer can contain $Al_xGa_{(1-x)}N$ ($0 \leq x \leq 1$).

The nitride semiconductor element of the first aspect can configure an ultraviolet light emitting element having the following configuration (9).

(9) A nitride semiconductor body formed in a part on the first nitride semiconductor layer and containing a second conductivity type second nitride semiconductor layer and a second electrode layer formed on the second nitride semiconductor layer of the nitride semiconductor body are included. The nitride semiconductor body also contains a nitride semiconductor light emitting layer between the first nitride semiconductor layer and the second nitride semiconductor layer. The nitride semiconductor light emitting layer emits ultraviolet light with a wavelength of 300 nm or less.

[Nitride Semiconductor Light Emitting Element of Second Aspect]

A nitride semiconductor light emitting element of a second aspect satisfies the nitride semiconductor element of the first aspect and the following configurations from (10) to (12).

(10) The first nitride semiconductor layer is a first Group III nitride semiconductor layer containing at least aluminum (Al) and gallium (Ga).

(11) A nitride semiconductor body formed in a part of the first Group III nitride semiconductor layer is included. The nitride semiconductor body contains a Group III nitride semiconductor active layer containing at least aluminum (Al) and gallium (Ga), an carrier blocking layer as an $Al_xGa_{(1-x)}N$ ($0.90 \leq x \leq 1.00$) layer, and a second Group III nitride semiconductor layer in this order from the substrate.

(12) A second electrode layer formed on the second Group III nitride semiconductor layer is included.

More specifically, the nitride semiconductor light emitting element of the second aspect has the substrate, the first Group III nitride semiconductor layer, the Group III nitride semiconductor active layer, the carrier blocking layer, the second Group III nitride semiconductor layer, the first electrode, and the second electrode.

The nitride semiconductor element of the second aspect having configurations of (10) through (12) preferably has all of or a part of the following configurations (13) through (19).

(13) The film thickness of the carrier blocking layer can be set to 5 nm or more and 18 nm or less.

(14) A graded layer can exist between the carrier blocking layer and the second Group III nitride semiconductor layer. The graded layer consists of an $Al_yGa_{(1-y)}N$ ($0.00 \leq y \leq 1.00$) layer and has Al composition y decreasing from the surface contacting to the carrier blocking layer toward the surface contacting to the second Group III nitride semiconductor layer.

(15) The film thickness of the graded layer can be set to 5 nm or more and 110 nm or less.

(16) The second Group III nitride semiconductor layer can be a GaN layer containing Mg as impurities in the range of $1 \times 10^{20}$ cm$^{-3}$ or more and less than $8 \times 10^{20}$ cm$^{-3}$.

(17) The film thickness of the second Group III nitride semiconductor layer can be set to 5 nm or more and 100 nm or less.

(18) The lattice relaxation rate of the first Group III nitride semiconductor layer is 0% or more and 15% or less.

(19) The substrate can be an AlN substrate.

The nitride semiconductor light emitting element of the second aspect can configure an ultraviolet light emitting element by applying the Group III nitride semiconductor active layer to emit ultraviolet light with a wavelength of 300 nm or less.

[Ultraviolet Light Emitting Module]

A light emitting device include the ultraviolet light emitting element contained in the nitride semiconductor light emitting element of the first aspect or the second aspect can be used as an ultraviolet light emitting module. The ultraviolet light emitting module is applicable to devices in the medical and life science field, the environmental field, the industry and industrial field, the life and household electrical appliance field, the agricultural field, and the other fields, for example.

The light emitting device include the ultraviolet light emitting element involved in the nitride semiconductor light emitting element of the first aspect or the second aspect is applicable to synthesis and decomposition devices of medicines or chemical substances, liquid, gas, and solid (containers, foods, medical instruments, and the like) sterilization devices, cleaning devices for semiconductors and the like, surface modification devices for film, glass, metal, and the like, exposure devices for producing semiconductors, FPDs, PCBs, and the other electronic articles, printing and coating devices, bonding and sealing devices, transfer and molding devices for films, patterns, mock-ups, and the like, and measurement and inspection devices for bills, flaws, blood, chemical substances, and the like.

Examples of the liquid sterilization devices include, but are not limited thereto, water supply tanks for automatic ice making devices, ice trays and storage containers, ice making machines in refrigerators, cold water tanks, hot water tanks, water flow piping of freezers, humidifiers, dehumidifiers, water reservoirs, stationary water purifiers, portable water purifiers, water suppliers, hot water suppliers, waste water treatment devices, disposers, drainage traps of toilet bowls, washing machines, water sterilization modules for dialysis, connector sterilizers for peritoneal dialysis, water storage systems for disasters, and the like.

Examples of the air sterilization devices include, but are not limited thereto, air purifiers, air-conditioners, ceiling fans, cleaners for floors and bedding, futon dryers, shoe dryers, washing machines, clothes dryers, indoor germicidal lamps, ventilation systems of storage warehouses, shoeboxes, wardrobes, and the like. Examples of the solid sterilization devices (including surface sterilization devices) include, but are not limited thereto, vacuum packing devices, belt conveyors, hand tool sterilization devices for medical use, dental use, barber shops, and beauty parlors, toothbrushes, toothbrush containers, chopstick cases, vanity bags, drain lids, private part washers of toilet bowls, toilet bowl lids, and the like.

EMBODIMENTS

Hereinafter, embodiments of the present invention are described but the present invention is not limited to the embodiments described below. The embodiments described below include technically preferable limitations to carry out the present invention but the limitations are not indispensable requirements of the present invention.

First Embodiment

A first embodiment describes an example in which the nitride semiconductor element of the first aspect of the present invention is applied to an ultraviolet light emitting element.

<Entire Configuration>

Figure 2:
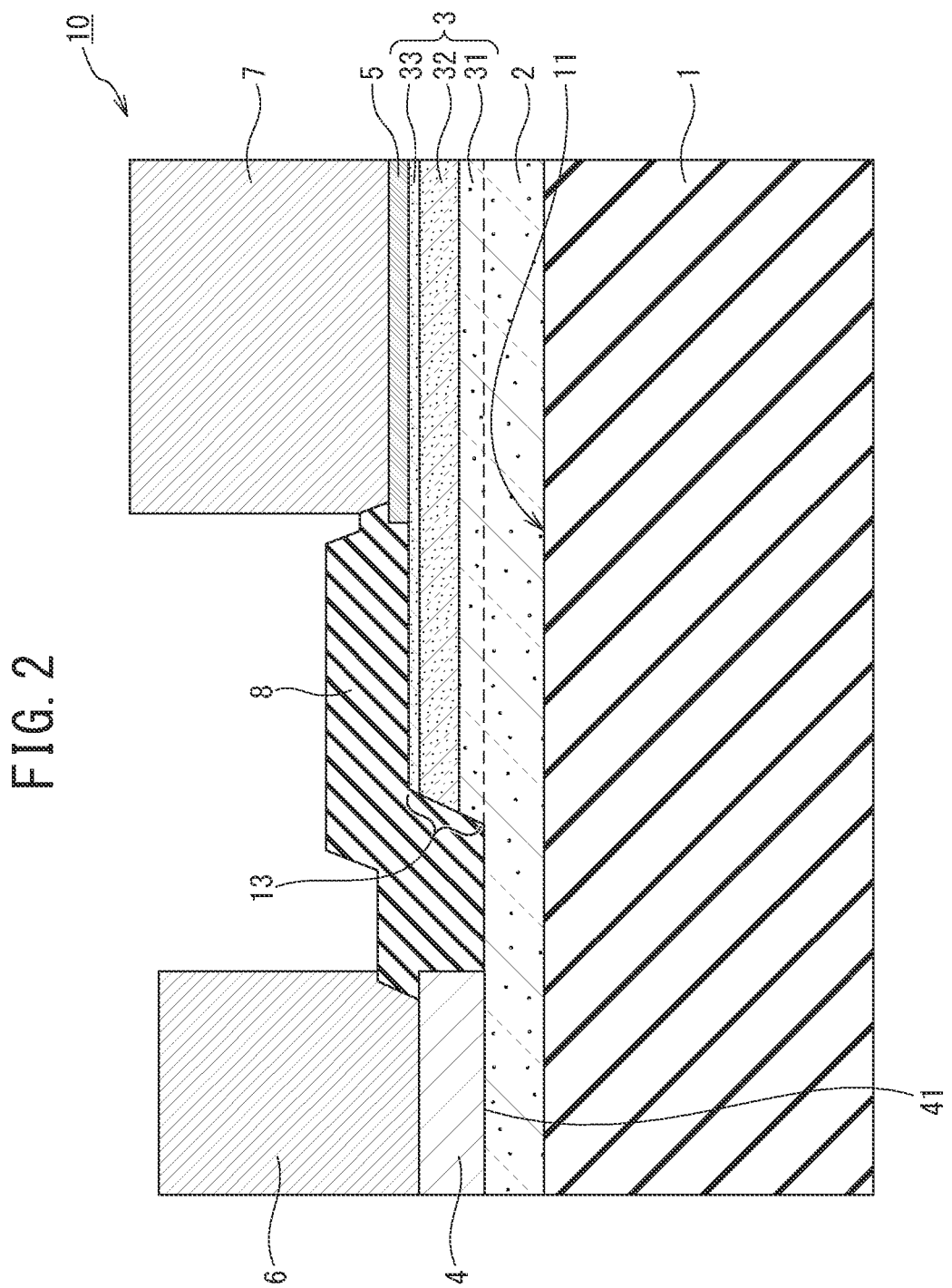
FIG. 2 is a cross-sectional view illustrating the nitride semiconductor element of the first embodiment corresponding to the A-A cross section of FIG. 1.
Figure 3:
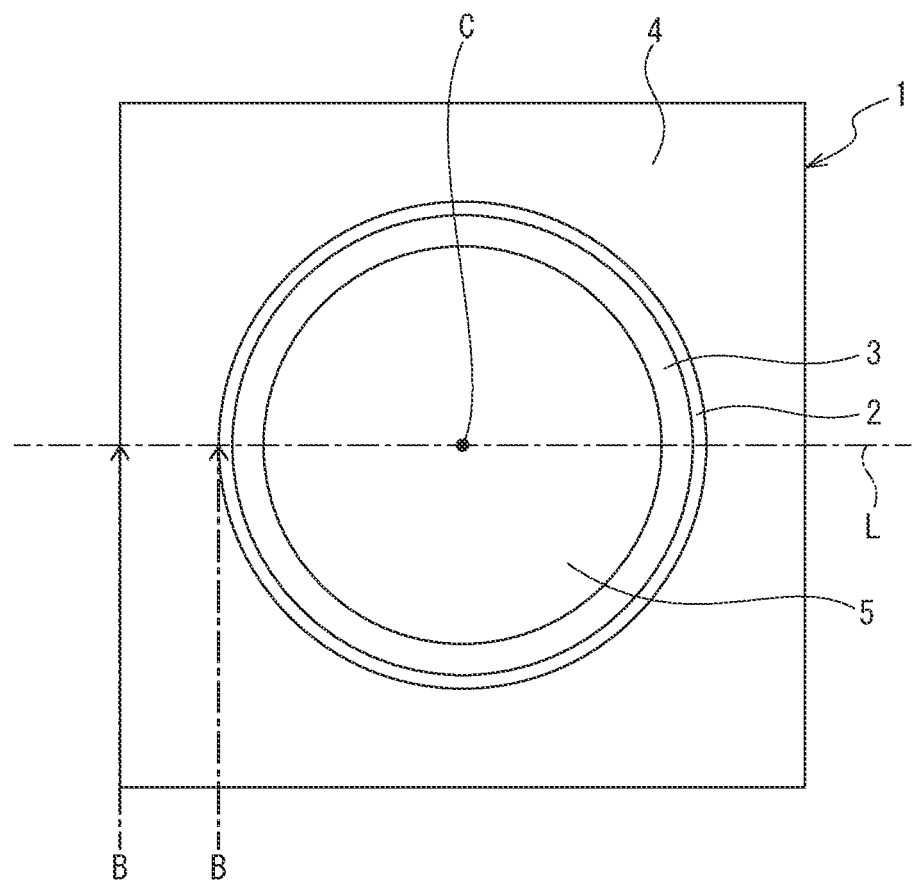
FIG. 3 is a plan view illustrating a state before pad electrodes and insulation layers are formed in the nitride semiconductor element of FIG. 1.

First, the entire configuration of an ultraviolet light emitting element 10 of this embodiment is described with FIG. 1 to FIG. 3.

As illustrated in FIG. 1 and FIG. 2, the ultraviolet light emitting element 10 has a substrate 1, an n-type nitride semiconductor layer (first conductivity type first nitride semiconductor layer) 2, a nitride semiconductor body 3, a first electrode layer 4, a second electrode layer 5, a first pad electrode 6, a second pad electrode 7, and an insulation layers 8.

The n-type nitride semiconductor layer 2 is formed on one surface 11 of the substrate 1. The nitride semiconductor body 3 is a mesa portion formed in a part on the n-type nitride semiconductor layer 2 and has a side surface 13 which is inclined. As illustrated in FIG. 2, the nitride semiconductor body 3 has an n-type nitride semiconductor layer 31, a nitride semiconductor light emitting layer 32, and a p-type nitride semiconductor layer (second conductivity type second nitride semiconductor layer) 33 formed in this order from the substrate 1 side.

As illustrated in FIG. 2, the n-type nitride semiconductor layer 31 of the nitride semiconductor body 3 is continuously formed on the n-type nitride semiconductor layer 2. During mesa etching process to form the nitride semiconductor body 3, a portion of the nitride semiconductor body 3 where the first electrode layer 4 and the insulation layers 8 to be deposited is removed with a certain depth in the thickness direction of the n-type nitride semiconductor layer 31.

The first electrode layer 4 is formed on the n-type nitride semiconductor layer 2 with a planar shape illustrated in FIG. 3. The second electrode layer 5 is formed on the p-type nitride semiconductor layer 33 with a planar shape illustrated in FIG. 3. More specifically, the second electrode layer 5 has a circular planar shape with a center C of the substrate 1 as the center and the first electrode layer 4 is disposed on the outside of the second electrode layer 5 and has an opening with a concentric circle shape having a diameter larger than the diameter of the circle of the second electrode layer 5 as an inner shape line of the planar shape. The first pad electrode 6 is formed on the first electrode layer 4 in the same planar shape as that of the first electrode layer 4. The second pad electrode 7 is formed on the second electrode layer 5 in the same planar shape as that of the second electrode layer 5.

Figure 6:
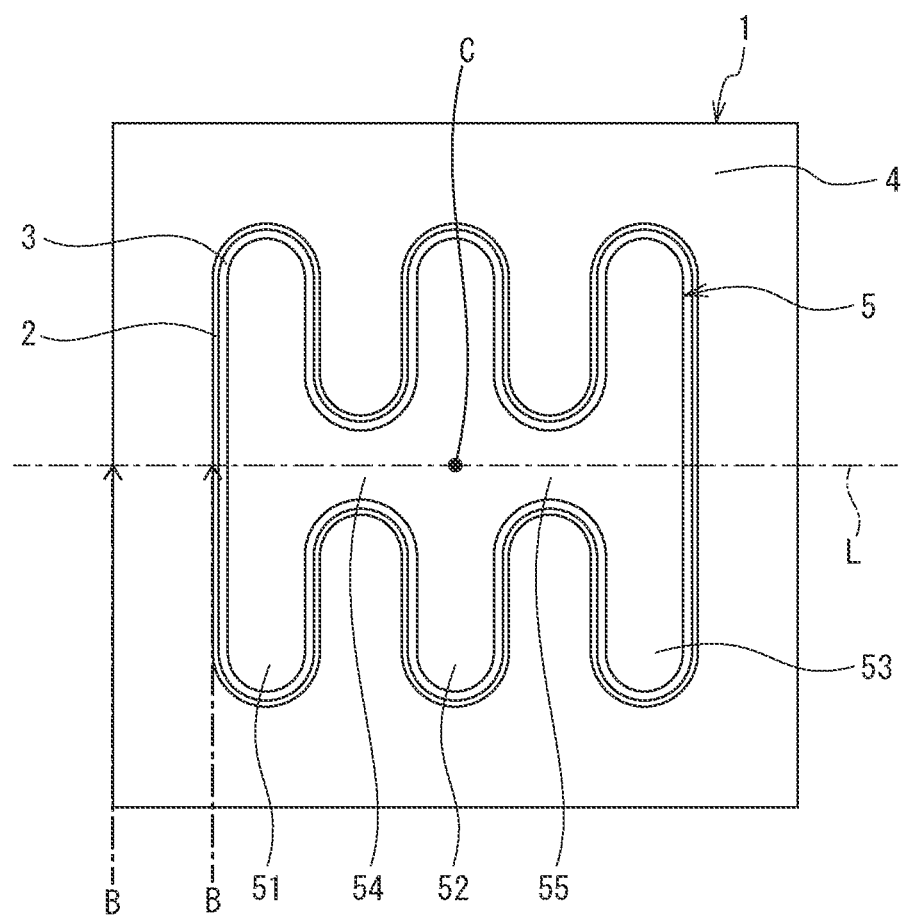
FIG. 6 is a plan view illustrating a state before pad electrodes and insulation layers are formed in a nitride semiconductor element in which the first electrode layer, the nitride semiconductor body, and the second electrode layer have planar shapes different from those of FIG. 3.

Other examples of the planar shapes of the first electrode layer 4 and the second electrode layer 5 include examples illustrated in FIG. 6 besides the examples illustrated in FIG. 3.

In the example of FIG. 6, the second electrode layer 5 has a planar shape containing three rod-like portions 51, 52, and 53 having the same length along one side of a rectangle forming the substrate 1, a connection portion 54 located between the rod-like portion 51 and 52 adjacent to each other, and a connection portion 55 located between the rod-like portion 52 and 53 adjacent to each other. The planar shape of the second electrode layer 5 is two-fold symmetric with respect to the center C of the substrate 1 as the center. The first electrode layer 4 is disposed on the outside of the second electrode layer 5 and has a line along the visible outline of the second electrode layer 5 through a fixed gap as an inner shape line of the planar shape.

In the example of FIG. 6, the inner shape line of the planar shape; i.e. perimeter, of the first electrode layer 4 is longer than that in the example of FIG. 3. The B-B cross section of FIG. 6 has the cross section illustrated in FIG. 5 as well as the B-B cross section of FIG. 3 in some cases.

When the example of FIG. 6 is compared with the example of FIG. 3, the perimeter of the inner shape line of the planar shape of the first electrode layer 4 is longer in the example of FIG. 6, and therefore the contact resistance of an ultraviolet light emitting element can be lowered. Thus, it is preferable from the viewpoint of reducing the contact resistance that the perimeter as viewed in plan of the nitride semiconductor body 3, the first electrode layer 4, the second electrode layer 5, the first pad electrode, and the second pad electrode are longer.

The ultraviolet light emitting element 10 is an element emitting ultraviolet light with a wavelength of 300 nm or less, for example.

The substrate 1 is not particularly limited insofar as long as a nitride semiconductor layer can be formed on the one surface 11. Specific examples of materials forming the substrate 1 include sapphire, Si, SiC, MgO, $Ga_2O_3$, $Al_2O_3$, ZnO, GaN, InN, AlN, or mixed crystals of sapphire, Si, SiC, MgO, $Ga_2O_3$, $Al_2O_3$, ZnO, GaN, InN, and AlN. Among the above, when a substrate consists with nitride semiconductors, such as GaN, AlN, and AlGaN, or sapphire is used, a nitride semiconductor layer grown on the substrate can have less crystal defects. This is because relatively smaller lattice constant mismatches and/or thermal expansion coefficient mismatches exist between the nitride substrates and the nitride semiconductor layer. Or lateral overgrowth technique and/or good quality templates growth on the sapphire substrate can reduce the defects to grow. Therefore, the substrates mentioned above are preferable and the AlN substrate is more preferably used. The materials forming the substrate 1 may contain impurities.

Examples of nitride semiconductor substrates mentioned above include one can be prepared by single crystal ingot of the nitride semiconductor which has enough thickness for the substrate or one can be prepared by growing the nitride semiconductor single crystal on a sapphire substrate or the like.

Materials for the n-type nitride semiconductor layer 2 and the n-type nitride semiconductor layer 31 are preferably single crystals or mixed single crystals of AlN, GaN, and InN, and n-$Al_xGa_{(1-x)}N$ (0≤x≤1) is mentioned as a specific example. Moreover, the materials may contain impurities, such as Group V elements other than N comprising P, As, and Sb, or C, H, F, O, Mg, and Si.

The Al composition x of the n-$Al_xGa_{(1-x)}N$ forming the n-type nitride semiconductor layer 2 is preferably 0.30≤x<0.95 and more preferably 0.50≤x<0.95. The n-type nitride semiconductor layer 2 may not be directly formed on the substrate 1 and may be formed on the substrate 1 having additional layers other than the n-type nitride semiconductor layer 2 on the top, such as a buffer layer, for example.

The nitride semiconductor light emitting layer 32 may be a single layer structure or a multilayer structure. Examples of the multilayer structure include a multi quantum well structure (MQW) comprising well layers containing AlGaN and barrier layers containing AlGaN or AlN. The nitride semiconductor light emitting layer 32 may contain impurities, such as Group V elements other than N comprising P, As, and Sb, or C, H, F, O, Mg, and Si.

Examples of the p-type nitride semiconductor layer 33 include a p-GaN layer or a p-AlGaN layer, for example, and can contain impurities, such as Mg, Cd, Zn, Be, and C.

Between the n-type nitride semiconductor layer 2 and the p-type nitride semiconductor layer 33, the carrier blocking layer and/or the graded layer can be contained. It is preferable to have the carrier blocking layer between the nitride semiconductor light emitting layer 32 and the p-type nitride semiconductor layer 33 and the graded layer between the carrier blocking layer and the p-type nitride semiconductor layer 33 in the viewpoint of improving the optical output power.

Materials of the first electrode layer 4 are described later.

As materials of the second electrode layer 5, when it is intended to inject holes into the nitride semiconductor element, the same materials as those of a p-type electrode layer of a general nitride semiconductor light emitting element can be used and, for example, Ni, Au, Pt, Ag, Rh, Pd, Pt, and Cu and alloys of Ni, Au, Pt, Ag, Rh, Pd, Pt, and Cu or ITO and the like can be applied. For the p-type electrode layer, Ni or Au or an alloy of Ni or Au or ITO having low contact resistance with the nitride semiconductor layer is preferable.

Examples of materials of the first pad electrode 6 and the second pad electrode 7 include Au, Al, Cu, Ag, W, and the like, for example, and materials containing Au which has high conductivity are desirable. To improve the adhesion of the pad electrodes 6 and 7, Ti layer can be formed underneath when Au is used.

The insulation layers 8 is formed in a portion not covered with the first electrode layer 4 of the n-type nitride semiconductor layer 2, a portion not covered with the second electrode layer 5 of the nitride semiconductor body 3, a portion not covered with the first pad electrode 6 of the first electrode layer 4, a portion not covered with the second pad electrode 7 of the second electrode layer 5, and the side surfaces of lower portions of the first pad electrode 6 and the second pad electrode 7. The insulation layers 8 covers a part of upper portions of the first pad electrode 6 and the second pad electrode 7 in some cases. Examples of the insulation layers 8 can be oxides or nitrides, such as SiN, $SiO_2$, SiON, $Al_2O_3$, and a ZrO layers, for example.

<Configuration of First Electrode Layer>

The first electrode layer 4 consists of materials containing aluminum and nickel. As materials of the first electrode layer 4, materials to improve the adhesion of electrodes, to prevent the oxidation of electrode materials, and the like as well as to reduce the contact resistance with n-AlGaN can be also used in addition to aluminum and nickel. Examples of such materials include Ti, Mo, V, Au, W, Pt, Pd, Si, Zr, and the like, for example. The first electrode layer 4 is preferably consists of materials containing titanium, aluminum, nickel, and gold.

In a contact surface 41 to the n-type nitride semiconductor layer 2 of the first electrode layer 4 or in the vicinity of the contact surface, both an aluminum substance and an alloy containing aluminum and nickel are sufficiently present. The total existence area ratio of the aluminum substance and the alloy containing aluminum and nickel in the contact surface 41 or in the vicinity of the contact surface 41 is 60% or more, or 70% or more. More specifically, it is preferable that the aluminum substance and the alloy containing aluminum and nickel are present in 60% by area or more, or 70% or more of the surface where the first electrode layer 4 covers the n-type nitride semiconductor layer 2, or a vicinity thereof.

Figure 4:
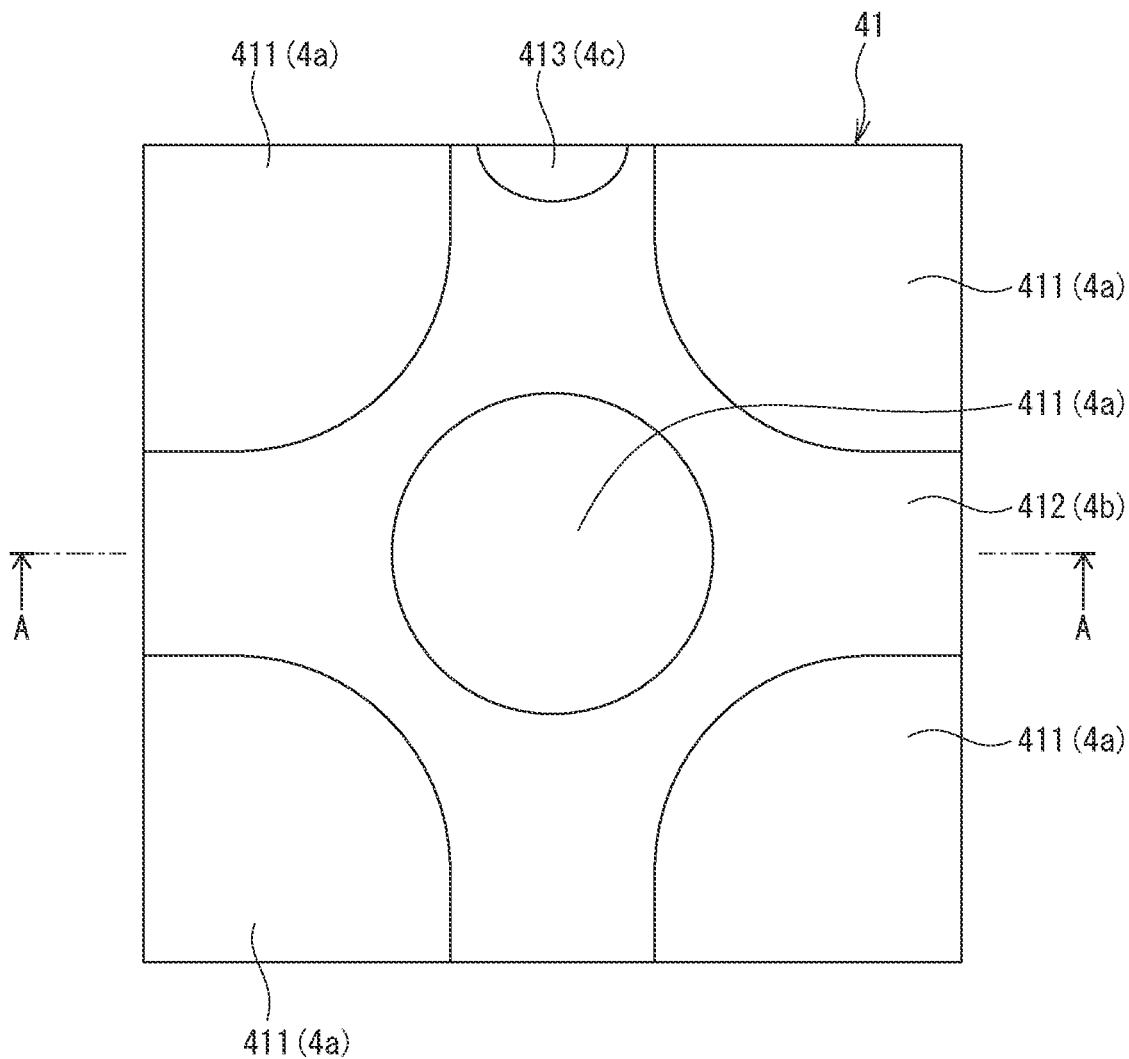
FIG. 4 is a plan view illustrating an example of a contact surface to a first nitride semiconductor layer of a first electrode layer configuring the nitride semiconductor element of the first embodiment and a second embodiment.

For example, in the contact surface 41 and a vicinity of the first electrode layer 4, a first region 411, a second region 412, and a third region 413 are present as illustrated in FIG. 4.

The first region 411 is the undersurface (surface on the side of the n-type nitride semiconductor layer 2) of a first layer 4a as an alloy layer containing aluminum and nickel. Most of components present in the undersurface include the alloy containing aluminum and nickel but Ti, Mo, V, Au, W, Pt, Pd, Si, Zr, and the like can be contained, for example. Ti, V, Zr, and Au can be more preferably contained, Ti, V, and Au can be still more preferably contained, Ti and Au can be yet still more preferably contained, and Ti can be most preferably contained in the interface which can be expected as reducing the resistance at the metal/semiconductor interface.

The second region 412 is the undersurface of a second layer 4b. The second layer 4b is an aluminum containing layer other than the alloy layer containing aluminum and nickel. Herein, the aluminum containing layer mostly contains aluminum but contains a very small amount (within several nanometers from the cross-section used for the area estimation of 4a and 4b) of electrode materials other than aluminum in some cases. The second layer 4b can contain Ti, Mo, V, Au, W, Pt, Pd, Si, Zr, and the like, for example. Ti, V, Zr, and Au can be more preferably contained, Ti, V, and Au can be still more preferably contained, Ti and Au can be yet still more preferably contained, and Ti can be most preferably contained in the interface which can be expected as reducing the resistance of the metal/semiconductor interface.

The third region 413 is the undersurface of a third layer 4c. In the third layer 4c, substances in which alloys other than the alloy containing aluminum and nickel and/or metals used as electrode materials which can be individually grained and the like are mixed.

Then, the sum of the area of the first region 411 as the undersurface of the alloy layer containing aluminum and nickel and the area of the aluminum substance present in the second region 412 is preferably 60% or more of the total area of the contact surface 41 and a vicinity thereof (comprising the first region 411, the second region 412, and the third region 413). The sum of the area is more preferably 70% or more, still more preferably 80% or more, and yet still more preferably 90% or more.

The first layer 4a is a two-component alloy layer of aluminum and nickel, for example, and the existence ratio of aluminum to nickel in the alloy layer is not limited. The first layer 4a may be a layer containing elements other than aluminum and nickel with aluminum and nickel. More specifically, the first layer 4a may be a layer containing a compound or a mixture of three or more components containing aluminum and nickel or a metal alloy layer of three or more components containing aluminum and nickel. The first layer 4a may contain Ti, Mo, V, Au, W, Pt, Pd, Si, Zr, and the like in addition to aluminum and nickel, for example.

The area ratio (hereinafter referred to as "aluminum content ratio") of the second region 412 to the total area of the first region 411 and the second region 412 is preferably 30% or more. The aluminum content ratio is more preferably 40% or more and still more preferably 50% or more.

Most of the components contained in the first region 411 include an alloy containing aluminum and nickel but Ti, Mo, V, Au, W, Pt, Pd, Si, Zr, and the like may be contained, for example. Ti, V, Zr, and Au can be more preferably contained, Ti, V, and Au can be still more preferably contained, Ti and Au can be yet still more preferably contained, and Ti can be most preferably contained in the interface which can be expected as reducing the resistance of the metal/semiconductor interface.

In the second region 412, the aluminum substance can form a continuous layer, the aluminum substance may be present in a state of being mixed with the other elements, a compound of aluminum and the other elements may be present, or an alloy of metal other than nickel and aluminum may be present. In the second region 412, Ti, Mo, V, Au, W, Pt, Pd, Si, Zr, and the like may be contained, for example. Ti, V, Zr, and Au can be more preferably contained, Ti, V, and Au can be still more preferably contained, Ti and Au can be yet still more preferably contained, and Ti can be most preferably contained in the interface which can be expected as reducing the resistance of the metal/semiconductor interface.

Figure 5:
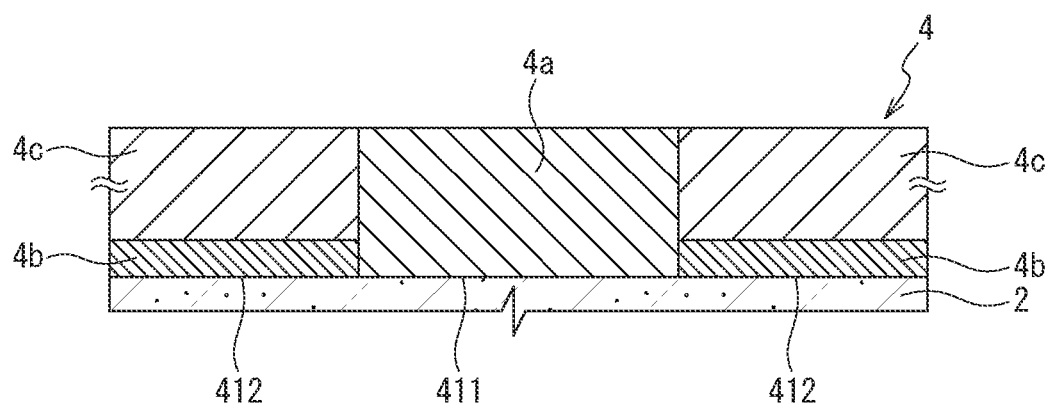
FIG. 5 is a cross-sectional view illustrating the first electrode layer configuring the nitride semiconductor elements of the first and the second embodiments corresponding to the B-B cross section of FIG. 3 or the B-B cross section of FIG. 6, for example.

As illustrated in FIG. 5 corresponding to the A-A cross section of FIG. 4, the first layer 4a is present in a central portion in the width direction of the first electrode layer 4 and stacking portions of the second layer 4b and the third layer 4c formed on the second layer 4b are present on the right and left sides of the first electrode layer 4.

The A-A cross section of FIG. 4 is a cross section perpendicular to the substrate 1 and along the straight line passing through the center of the substrate 1 and extending from one end to the other end of the substrate 1 as viewed in plan. More specifically, a plurality of FIG. 5 or FIG. 4 is repeatedly combined, the combined figure correspond to the B-B cross section of FIG. 3, for example. In FIG. 1 and FIG. 3, a straight line L is an example of the straight line passing through the center C of the substrate 1 and extending from one end to the other end of the substrate 1 as viewed in plan.

The thickness of the first layer 4a can be 100 nm or more and 1000 nm or less, more preferably 100 nm or more and 600 nm or less. The thickness of the second layer 4b can be 1 nm or more and 150 nm or less, more preferably 1 nm or more and 100 nm or less. The thickness of the third layer 4c is not limited but preferably smaller than the thickness of the first layer 4a and larger than the thickness of the second layer 4b. In the cross section perpendicular to the substrate 1 and along the straight line L passing through the center of the substrate 1 and extending from one end to the other end of the substrate 1 as viewed in plan, the area ratio of the first layer (alloy layer containing aluminum and nickel) 4a to the second layer (aluminum containing layer) 4b satisfies First layer 4a:Second layer 4b=1:2 to 400:1, more preferably 2:35 to 400:1.

<Function and Effects Obtained by Configuration of First Electrode Layer>

In the ultraviolet light emitting element 10 of the first embodiment, due to the presence of both the aluminum substance and the alloy containing aluminum and nickel in the contact surface 41 or in the vicinity of the contact surface 41 to the n-type nitride semiconductor layer 2 of the first electrode layer 4, contact resistance can be greatly reduced even when the n-type nitride semiconductor layer 2 is n-$Al_xGa_{(1-x)}N$ (0.50≤x<0.95). Since the contact resistance is reduced, a forward voltage of the ultraviolet light emitting element 10 can be lower. Therefore, an optical power output becomes higher and/or lifetime becomes longer because the amount of heat generation is reduced in the ultraviolet light emitting element 10.

Because the amount of heat generation in the ultraviolet light emitting element 10 is reduced, smaller size of heat sink for the nitride semiconductor light emitting device containing the ultraviolet light emitting element 10 can be applied, and therefore a size reduction of the nitride semiconductor light emitting device can be achieved.

In the ultraviolet light emitting element 10 of the first embodiment, the aluminum substance is present in the contact surface 41 or in the vicinity of the contact surface 41 which means a high conductivity layer is formed on or near the interface with the n-type nitride semiconductor layer 2 of the first electrode layer 4, and therefore a current can be easily spread in the lateral direction of the first electrode layer 4 so that contact resistance can be reduced and/or current crowding can be mitigated. Moreover, due to the presence of the aluminum substance in the contact surface 41 or in the vicinity of the contact surface 41 to the n-type nitride semiconductor layer 2 of the first electrode layer 4, the reflectance on or near the interface with the n-type nitride semiconductor layer 2 of the first electrode layer 4 can be increased, and therefore optical power output can be increased. Although the effects mentioned above can be obtained even by aluminum in an alloy containing aluminum, the effects obtained by the aluminum substance are higher.

In the ultraviolet light emitting element 10 of the first embodiment, the alloy containing aluminum and nickel is present in the contact surface 41 or in the vicinity of the contact surface 41 to the n-type nitride semiconductor layer 2 of the first electrode layer 4. Such a first electrode layer 4 can be formed under the condition where the alloy containing aluminum and nickel is easily formed, e.g., under the condition where a high resistance alloy, such as an alloy of aluminum and gold, is harder to be formed. As a result, the formation of the high resistance alloy is reduced, and therefore the contact resistance is reduced.

Moreover, due to the presence of the alloy containing aluminum and nickel in the contact surface 41 or in the vicinity of the contact surface 41 to the n-type nitride semiconductor layer 2 of the first electrode layer 4, the upper surface (surface on the side opposite to the contact surface 41) of the first electrode layer 4 becomes rough. In connection therewith, the adhesion of the first electrode layer 4 and the pad electrode 6 improves, and therefore the lifetime of the ultraviolet light emitting element 10 can be longer. Although the effect can be obtained also due to the presence of aluminum in the contact surface 41 or in the vicinity of the contact surface 41, better effect is obtained when the alloy containing aluminum and nickel is present.

The thickness of the first layer (alloy layer containing aluminum and nickel) 4a of the first electrode layer 4 is preferably 100 nm or more from the viewpoint of the reduction in contact resistance and the better adhesion with the pad electrode 6 described above. Moreover, when the thickness of the first layer 4a is excessively large, the first electrode layer 4 becomes too rough to be covered by the pad electrode 6 or the insulation film 8 formed on the first electrode layer 4 which can lead to increase the risk of poor reliability. Therefore, the thickness of the first layer 4a is preferably 1000 nm or less and more preferably 600 nm or less. From these viewpoints, the thickness of the first layer 4a of the first electrode layer 4 is set to 100 nm or more and 1000 nm or less in the ultraviolet light emitting element 10 of this embodiment. The thickness of the first layer 4a of the first electrode layer 4 is more preferably 100 nm or more and 600 nm or less.

The thickness of the second layer (aluminum containing layer) 4b of the first electrode layer 4 is preferably 1 nm or more and more preferably 10 nm or more from the viewpoint of a reduction in contact resistance and better reflectance. Moreover, when the thickness of the second layer 4b is too thick, the thickness of the third layer 4c becomes less, so that the second layer 4b is less covered by the third layer 4c and is easier to be exposed to oxygen and then oxidized. Therefore, from the viewpoint of avoiding the oxidation of the first electrode layer 4, the thickness of the second layer 4b is preferably 150 nm or less, more preferably 100 nm or less. From these viewpoints, the thickness of the second layer 4b of the first electrode layer 4 is set to 1 nm or more and 150 nm or less in the ultraviolet light emitting element 10 of the first embodiment. The thickness of the first layer 4b of the first electrode layer 4 is more preferably 1 nm or more and 100 nm or less.

From the viewpoint of achieving both the reduction in contact resistance and better reflectance and adhesion with pad electrodes, the area ratio of the first layer 4a to the second layer 4b of the first electrode layer 4 preferably in cross section satisfies First layer 4a:Second layer 4b=1:2 to 400:1, more preferably First layer 4a:Second layer 4b=2:35 to 400:1 in the ultraviolet light emitting element 10 of this embodiment.

Although the first embodiment describes the example in which the nitride semiconductor element of the first aspect of the present invention is applied to the ultraviolet light emitting element, the other examples include a nitride semiconductor light emitting element and a nitride semiconductor sensor element whose emission or detection wavelength is not limited to 300 nm or less, a power device, and a transistor.

Second Embodiment

A second embodiment describes an example in which the nitride semiconductor light emitting element of the second aspect of the present invention is applied to an ultraviolet light emitting element. The conductivity type of a first Group III nitride semiconductor layer is set to an n-type and the conductivity type of a second Group III nitride semiconductor layer is set to a p-type.

<Entire Configuration>

Figure 7:
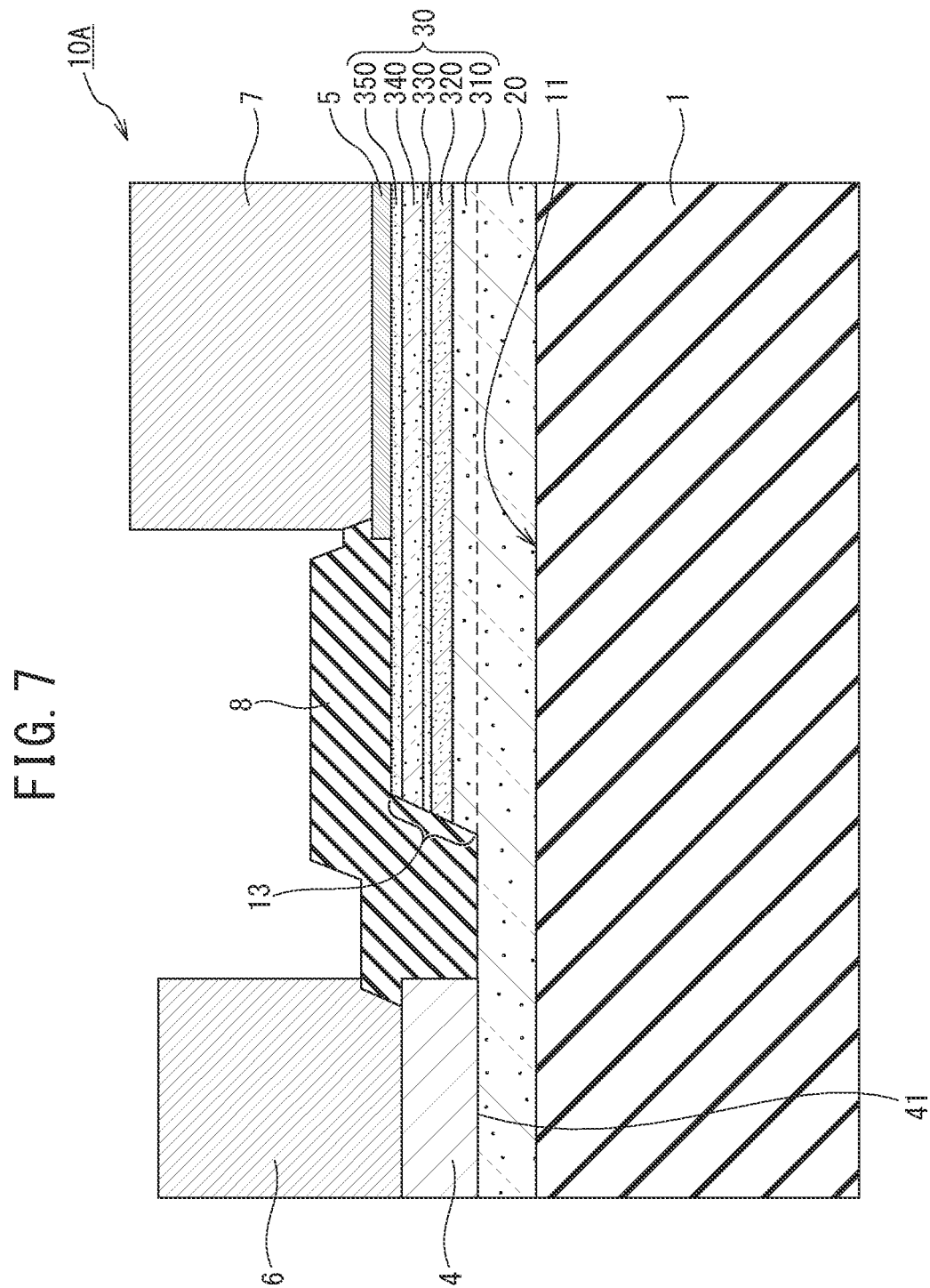
FIG. 7 is a cross-sectional view illustrating the nitride semiconductor element of the second embodiment corresponding to the A-A cross-sectional view of FIG. 1.
Figure 8:
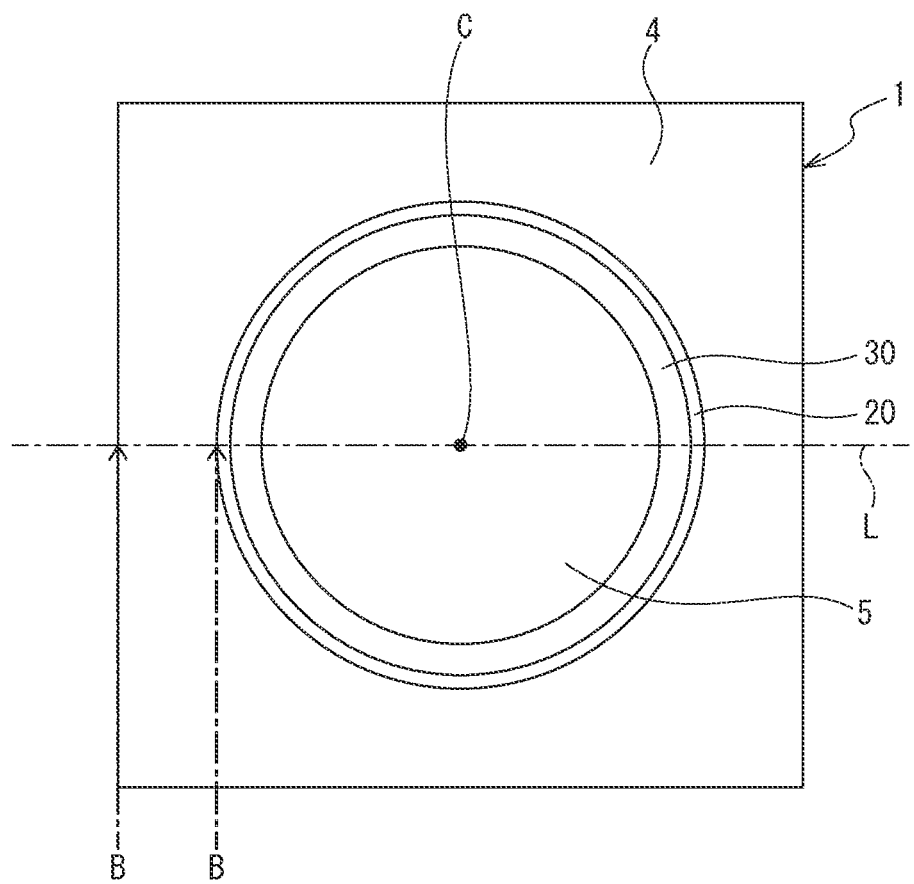
FIG. 8 is a plan view illustrating a state before pad electrodes and insulation layers are formed in the nitride semiconductor element of FIG. 7.

First, the entire configuration of an ultraviolet light emitting element 10A of this embodiment is described with FIG. 7 and FIG. 8.

As illustrated in FIG. 7, the ultraviolet light emitting element 10A has a substrate 1, an n-type Group III nitride semiconductor layer (first Group III nitride semiconductor layer) 20, a nitride semiconductor body 30, a first electrode layer 4, a second electrode layer 5, a first pad electrode 6, a second pad electrode 7, and an insulation layers 8. The n-type Group III nitride semiconductor layer 20 is formed on the substrate 1. The nitride semiconductor body 30 is a mesa portion formed in a part on the n-type Group III nitride semiconductor layer 20 and the side surface 13 which is inclined surface.

As illustrated in FIG. 7, the nitride semiconductor body 30 has an n-type Group III nitride semiconductor layer 310, a Group III nitride semiconductor active layer (light emitting layer) 320, a carrier blocking layer 330, a graded layer 340, and a p-type Group III nitride semiconductor layer (second Group III nitride semiconductor layer) 350 formed in this order from the substrate 1 side.

The nitride semiconductor body 30 is formed during mesa etching process by removing a portion where the first electrode layer 4 and insulation layers 8 to be formed with a certain depth in the thickness direction of the n-type Group III nitride semiconductor layer 310. More specifically, the n-type Group III nitride semiconductor layer 310 of the nitride semiconductor body 30 is continuously formed on the n-type Group III nitride semiconductor layer 20.

The first electrode layer 4 is formed on the n-type Group III nitride semiconductor layer 20 with a planar shape illustrated in FIG. 8, for example. The second electrode layer 5 is formed on the p-type Group III nitride semiconductor layer 350 with a planar shape illustrated in FIG. 8, for example. More specifically, the second electrode layer 5 has a circular planar shape with the center C of the substrate 1 as the center and the first electrode layer 4 is disposed on the outside of the second electrode layer 5 and has an opening with a concentric circle shape having a diameter larger than the diameter of the circle of the second electrode layer 5 as an inner shape line; i.e. perimeter, of the planar shape. The first pad electrode 6 is formed on the first electrode layer 4 with the same planar shape as that of the first electrode layer 4. The second pad electrode 7 is formed on the second electrode layer 5 with the same planar shape as that of the second electrode layer 5. Examples of the planar shapes of the first electrode layer 4 and the second electrode layer 5 also include examples illustrated in FIG. 12 besides the examples illustrated in FIG. 8 as well as the first embodiment includes FIG. 3 and FIG. 6.

The ultraviolet light emitting element 10A is an element emitting ultraviolet light with a wavelength of 300 nm or less, for example.

The first electrode layer 4, the second electrode layer 5, the first pad electrode 6, the second pad electrode 7, and the insulation layers 8 are the same as those of the first embodiment. The description in the first embodiment can be read as a description in the second embodiment by reading the n-type nitride semiconductor layer 2 as the n-type Group III nitride semiconductor layer 20 and reading the nitride semiconductor body 3 as the nitride semiconductor body 30 in the description of the first embodiment.

When intermediate layers are present between the alloy layer and the n-type Group III nitride semiconductor layer 20 and/or between the aluminum containing layer and the n-type Group III nitride semiconductor layer 20, the undersurfaces of the alloy layer and/or the aluminum containing layer do not become the contact surfaces with the n-type Group III first nitride semiconductor layer 20. In this case, the total existence area ratio of the above-described configuration (4) is not the existence area ratio in the contact surface but the existence area ratio in the vicinity surface of the contact surface and is the existence area ratio in the contact surface when the alloy layer and the aluminum containing layer contact to the first nitride semiconductor layer 20.

Next, details of each component are described.
<Substrate>

The substrate 1 is not particularly limited insofar as long as a nitride semiconductor layer can be formed. Specific examples of materials forming the substrate 1 include sapphire, Si, SiC, MgO, $Ga_2O_3$, ZnO, GaN, InN, AlN, or mixed crystals of sapphire, Si, SiC, MgO, $Ga_2O_3$, ZnO, GaN, InN, and AlN. Among the above, when a substrate consists with nitride semiconductors, such as GaN, AlN, and AlGaN, is used, a nitride semiconductor layer grown on the substrate can have less crystal defects because smaller lattice constant mismatches and/or thermal expansion mismatches exist between the substrate 1 and the nitride semiconductor layer. Therefore, the substrates are preferable. In particular, an AlN substrate is preferably used. The materials forming the substrate 1 may contain impurities.

For the substrates containing the nitride semiconductors as materials described above, one can be prepared by single crystal ingot of the nitride semiconductor which has enough thickness for the substrate or one can be prepared by growing the nitride semiconductor single crystal on a sapphire substrate (so-called template) is mentioned. As the sapphire substrate for templates, a C-plane sapphire substrate is desirably used because a flatter grown surface can be relatively easily achieved but the sapphire substrate for templates is not limited thereto.

(Measurement of Impurity Density)

The concentration of dopants or impurities of the substrate 1 and each layer can be quantified using secondary ion mass spectrometry (SIMS) and X-ray photoelectron spectroscopy (XPS). The XPS measures and analyzes a photoelectron spectrum obtained by excitation with X-rays or the like. Also, the concentration of n-type and p-type dopants (Si, Mg) described later can be quantified by the measurements.

<First Group III Nitride Semiconductor Layer>

The first Group III nitride semiconductor layer is a first conductivity type semiconductor layer consists of materials containing at least Al and Ga. Materials forming the first Group III nitride semiconductor layer are preferably single crystals or mixed single crystals of AlN, GaN, and InN. The materials may contain impurities, such as Group V elements other than N comprising P, As, and Sb, or C, H, F, O, Mg, and Si, and the type of the impurities is not limited thereto.

When the first Group III nitride semiconductor layer is used as an electron injection layer, the first conductivity type is an n-type. A specific example of the first Group III nitride semiconductor layer includes $n-Al_xGa_{(1-x)}N$ (0<x≤1) to which Si is doped as an n-type dopant. When a Group III nitride semiconductor active layer which can emit deep ultraviolet light of 300 nm or less is further grown on the first Group III nitride semiconductor layer, the Al composition is preferably higher from the viewpoint of reducing a lattice constant mismatch from a base and reducing crystal defects. On the other hand, too high Al composition leads to increasing the resistance of the metal/semiconductor interface, and therefore the Al composition x of $n-Al_xGa_{(1-x)}N$ is preferably 0.50≤x≤0.80 and more preferably 0.60≤x≤0.75.

When lattice relaxation of the first Group III nitride semiconductor layer happens to the base, the electron concentration or the electron mobility in the layer decreases, so that the sheet resistance of the first Group III nitride semiconductor layer in increased. As a result, a forward voltage of the light emitting element is increased. Therefore, the lattice relaxation rate of the first Group III nitride semiconductor layer is preferably 0% or more and 15% or less and more preferably 0% or more of 12% or less.

Examples of methods for reducing the lattice relaxation rate include reducing a lattice constant mismatch from the base and reducing the thickness of the first Group III nitride semiconductor layer. When an $n-Al_xGa_{(1-x)}N$ layer is grown on the AlN substrate, the film thickness is preferably 1.3 μm or less and more preferably 1.2 μm or less with the Al composition range (0.50≤x<0.80) described above from the viewpoint of suppressing the lattice relaxation. On the other hand, the thickness of the first Group III nitride semiconductor layer is preferably 100 nm or more from the viewpoint of fabrication process. Therefore, the thickness of the $n-Al_xGa_{(1-x)}N$ layer is preferably 100 nm or more and 1.3 μm or less and more preferably 100 nm or more and 1.2 μm or less.

The first Group III nitride semiconductor layer may not be directly grown on the substrate and may be formed on the substrate 1 having additional layers other than the first conductivity type nitride semiconductor layer 20 on the top, such as a buffer layer, for example. Materials and the thickness of the buffer layer are not particularly limited.

(Method for Measuring Al Composition)

The Al composition x and the lattice relaxation rate of the first Group III nitride semiconductor layer can be quantified by performing Reciprocal Space Mapping Measurement (RSM) by X-Ray Diffraction (XRD). At this time, the lattice relaxation rate to the base and the Al composition are obtained by analyzing the reciprocal space mapping data around the diffraction peak at an asymmetrical plane as a diffraction plane. As the diffraction plane, a (10-15) plane or a (20-24) plane can be used.

<Group III Nitride Semiconductor Active Layer>

The Group III nitride semiconductor active layer may be a single layer structure or a multilayer structure. Examples of the multilayer structure include a multi quantum well structure (MQW) comprising well layers containing AlGaN and barrier layers containing AlGaN or AlN. The emission wavelength obtained from the light emitting element 10A can be adjusted by changing the Al composition or the thickness of the well layers and the barrier layers. The layers may contain impurities, such as Group V elements other than N including P, As, and Sb, or C, H, F, O, Mg, and Si, and the type of the impurities is not limited thereto.

<Carrier Blocking Layer>

The carrier blocking layer is very important from the viewpoint of efficient injection of electrons and holes into the Group III nitride semiconductor active layer. Specifically, the carrier blocking layer acts as a potential barrier to electrons injected from the first Group III nitride semiconductor layer and promotes electron confinement in the active layer. In addition thereto, because the active layer is stressed by the carrier blocking layer, an internal electric field is generated in the active layer and holes supplied from the graded layer and the second Group III nitride semiconductor layer are accelerated by the electric field, whereby the injection efficiency into the active layer improves. From the description above, by applying the carrier blocking layer, electrons and holes can be efficiently injected into the active layer, so that high efficiency of light emitting element can be achieved.

The carrier blocking layer is an $Al_xGa_{(1-x)}N$ ($0.90 \leq x \leq 1.00$) layer. The carrier blocking layer may also contain impurities.

As described above, the thickness of the carrier blocking layer is preferably 5 nm or more and 18 nm or less and more preferably 7 nm or more and 14 nm or less from the viewpoint of efficient carrier injection into a light emitting layer. When the thickness is too thin, electrons can leak from the active layer by the quantum tunneling effect and a stress applied to the active layer decreases, and therefore the efficiency of light emitting element decreases. On the other hand, when the thickness is too thick, the injection of holes is blocked, and therefore the efficiency of light emitting element decreases. Therefore, the thickness of the carrier blocking layer has an optimal range.

(Method for Measuring Thickness)

The thickness of each layers of a semiconductor multilayer structure can be measured by cutting out a predetermined cross section perpendicular to a substrate, observing the cross section under a Transmission Electron Microscope (TEM), and then using a length measuring function of the TEM. As a measurement method, a cross section perpendicular to the main surface of the substrate of the nitride semiconductor light emitting element is first observed using the TEM. Specifically, in a TEM image including the cross section perpendicular to the main surface of the substrate of the nitride semiconductor light emitting element, a 2 μm or more range in a direction parallel to the main surface of the substrate is set as the observation width, for example. In the observation width range, a contrast is observed at the interface between carrier blocking layer and a layer which has different composition from the carrier blocking layer, and therefore the thickness to the interface is observed in a 200 nm wide continuous observation region. The thickness of the carrier blocking layer is obtained by calculating the average value of the thicknesses of the carrier blocking layer contained in the 200 nm wide observation region from 5 places arbitrarily extracted from the 2 μm or more observation width.

(Method for Measuring Composition)

Examples of methods for measuring the composition include XPS, Energy Dispersive X-ray spectrometry (EDX), and Electron Energy Loss Spectroscopy (EELS) measurement.

In the EELS, the composition of a sample is analyzed by measuring the energy lost when an electron beam transmits through the sample. Specifically, an energy loss spectrum of the intensity of a transmitted electron beam is measured and analyzed in a sliced sample which is used for the TEM observation or the like for example. Then, the Al composition x can be identified from a peak position of the peak appearing around the energy loss amount of 20 eV utilizing the fact that the peak position changes according to the Al composition x of the carrier blocking layer.

The Al composition of the carrier blocking layer is obtained by calculating the average value of the Al composition in the 200 nm observation width from 5 places arbitrarily extracted from the 2 μm or more observation region in the same manner as in the film thickness calculation method by the TEM observation described above.

In the EDX, a characteristic X-ray generated with an electron beam in a sliced sample used for the TEM observation described above or the like are measured and analyzed. The Al composition of the carrier blocking layer is obtained by calculating the average value of the Al composition in the 200 nm observation width from 5 places arbitrarily extracted from the 2 μm or more observation region in the same manner as in the film thickness calculation method by the TEM observation described above.

In the XPS, the evaluation in the depth direction can be measured by the XPS measurement while performing sputter etching using ion beams. For the ion beams, $Ar^+$ is generally used. However, the other ion species, such as Ar cluster ions, may be acceptable, for example insofar as the ions can be emitted from an ion gun for etching mounted in an XPS device. The XPS peak intensities of Al, Ga, and N are measured and analyzed to obtain the depth direction distribution of the Al composition x of the carrier blocking layer. The Al composition x can be obtained also by a method including performing angled polishing from the main surface of the substrate, instead of sputter etching, so that a cross section perpendicular to the main surface of the substrate of the nitride semiconductor light emitting element is expanded and exposed, and then measuring the exposed cross section.

Also when Auger Electron Spectroscopy (AES) is used without being limited to the XPS, the Al composition can be measured by measuring the cross section exposed by sputter etching or the angled polishing from the substrate. Moreover, the Al composition can be measured also using SEM-EDX measurement of the cross section exposed by the angled polishing from the substrate.

<Second Group III Nitride Semiconductor Layer>

The second Group III nitride semiconductor layer is a second conductivity type Group III nitride semiconductor layer. More specifically, the conductivity type of the second Group III nitride semiconductor layer is different from the conductivity type (first conductivity type) of the first Group III nitride semiconductor layer.

When the second Group III nitride semiconductor layer is used as a hole injection layer, the second conductivity type is a p-type.

Materials of the second Group III nitride semiconductor layer are preferably single or mixture of crystals comprising AlN, GaN, and InN. As the p-type Group III nitride semiconductor layer, a p-GaN layer, a p-AlGaN layer, or the like, is used, for example, and a p-GaN layer is more preferable from the viewpoint of improving the contact properties with the second electrode layer. Impurities, such as C, H, F, O, Mg, and Si, may be contained and the type of the impurities is not limited thereto.

The film thickness of the second Group III nitride semiconductor layer is preferably 5 nm or more and 100 nm or less and more preferably 5 nm or more and 20 nm or less. By specifying the film thickness range described above, when the Group III nitride semiconductor active layer is configured to emit ultraviolet light, the efficiency of a light emitting element can be improved (in a state where the absorption or the loss is suppressed) and a good contact to the second electrode layer can be maintained and an increase in forward voltage or electrical failure can be suppressed.

Examples of the p-type dopants include Mg, Cd, Zn, Be, and the like. When Mg is used as the p-type dopant, the Mg doping concentration is preferably $1 \times 10^{20}$ cm$^{-3}$ or more and less than $8 \times 10^{20}$ cm$^{-3}$ and more preferably $2 \times 10^{20}$ cm$^{-3}$ or more and $6 \times 10^{20}$ cm$^{-3}$ or less from the viewpoint of improving the flatness of the surface of the p-GaN layer and improving the contact properties with the second electrode layer.

<Graded Layer>

The graded layer is an $Al_yGa_{(1-y)}N$ ($0.00 \leq y \leq 1.00$) layer and is a layer having an Al composition y decreasing from the surface in contact with the carrier blocking layer toward the surface in contact with the second group III nitride semiconductor layer.

The Al composition y of the graded layer may continuously decrease or may intermittently decrease from the surface in contact with the carrier blocking layer toward the surface in contact with the second group III nitride semiconductor layer. The "intermittently decreases" means that portions of the same Al composition y are contained in the film thickness direction of the graded layer. More specifically, the graded layer may contain a portion where the Al composition y does not decrease from the carrier blocking layer side toward the second Group III nitride semiconductor layer side but does not contain a portion where the Al composition y increases. The graded layer contains the portions having the same Al composition y with a thickness of several nm in some cases.

When the Al composition of the graded layer in the surface in contact with the carrier blocking layer is defined as y1 and the Al composition of the graded layer in the surface in contact with the second Group III nitride semiconductor layer is defined as y2, y1>y2 is established but y1 and y2 values are not particularly limited.

The Al composition y1 of the graded layer and the Al composition x of the carrier blocking layer may be the same or may be different from each other. When different from each other, it does not matter which of the Al composition y1 of the graded layer or the Al composition x of the carrier blocking layer is larger. The Al composition y2 of the graded layer and the Al composition of the second Group III nitride semiconductor layer may be the same or may be different from each other. When different from each other, it does not matter which of the Al composition y2 of the graded layer or the Al composition of the second Group III nitride semiconductor layer is larger.

From the viewpoint of reducing the potential barrier in the interface in each layer and increasing the injection efficiency of holes from the graded layer, a difference between the Al composition y1 of the graded layer and the Al composition x of the carrier blocking layer is preferably 0.3 or less and a difference between the Al composition y2 of the graded layer and the Al composition of the second Group III nitride semiconductor layer is preferably 0.4 or less.

The graded layer may contain impurities, such as C, H, F, O, Mg, and Si.

The graded layer generates holes by a polarization doping effect and injects the holes into an active layer efficiently. Therefore, by including the graded layer between the carrier blocking layer and the second Group III nitride semiconductor layer, efficiency of a light emitting element can be increased.

The film thickness of the graded layer is preferably 5 nm or more and 110 nm or less, more preferably 15 nm or more and 90 nm or less, and still more preferably 20 nm or more and 70 nm or less from the viewpoint of increasing the efficiency of a light emitting element.

(Method for Measuring Composition)

Examples of methods for measuring the composition include XPS, Energy Dispersive X-ray Spectrometry (EDX), and Electron Energy Loss Spectroscopy (EELS).

<Function and Effects>

<<Effects Obtained by Carrier Blocking Layer>>

In the ultraviolet light emitting element 10A of the second embodiment, the carrier injection efficiency into a light emitting layer improves by including an $Al_xGa_{(1-x)}N$ layer having an Al composition x of 0.90 or more and 1.00 or less with a film thickness of 5 nm or more and 18 nm or less as the carrier blocking layer 330, and therefore high efficiency of the light emitting element 10A is obtained.

<<Effects Obtained by Graded Layer>>

In the ultraviolet light emitting element 10A of the second embodiment, the hole injection efficiency into a light emitting layer improves due to the presence of the graded layer 340 having a film thickness of 5 nm or more and 110 nm or less, and therefore high efficiency of the light emitting element is obtained.

<<Function and Effects Obtained by Configuration of First Electrode Layer>>

The ultraviolet light emitting element 10A of the second embodiment contains an n-$Al_xGa_{(1-x)}N$ layer having a high Al composition x of 0.50 or more and less than 0.80 as the n-type Group III semiconductor layer 2. Due to the presence of both an aluminum substance and an alloy containing aluminum and nickel in the contact surface 41 or in the vicinity of the contact surface 41 to the n-type semiconductor layer 2 of the first electrode layer 4, a contact resistance can be greatly reduced. Since the contact resistance is reduced, a forward voltage of the ultraviolet light emitting element 10A can be lowered, and therefore the heat generation amount of the ultraviolet light emitting element 10A can be reduced. Accordingly, an optical power output becomes high and/or lifetime becomes longer because the amount of heat generation in the ultraviolet light emitting element 10A is reduced.

Because the amount of heat generation in the ultraviolet light emitting element 10A is reduced, smaller size of heat sink for the nitride semiconductor light emitting device containing the ultraviolet light emitting element 10A can be applied, and therefore a size reduction of the nitride semiconductor light emitting device is achieved.

Furthermore, in the ultraviolet light emitting element 10A of the second embodiment, the aluminum substance present in the contact surface 41 or in the vicinity of the contact surface 41 to the n-type Group III nitride semiconductor layer which means a high conductivity layer is formed on or near the interface to the n-type Group III nitride semiconductor layer 20 of the first electrode layer 4. Therefore, a current can be easily spread in the lateral direction of the first electrode layer 4 so that contact resistance can be reduced and/or current crowding can be mitigated. Moreover, since the reflectance on or near the interface with the n-type Group III nitride semiconductor layer 20 of the first electrode layer 4 can be increased by the aluminum substance exists, the optical power output can be increased. Although the effects mentioned above can be obtained also by aluminum in an alloy containing the aluminum, the effects obtained by the aluminum substance are higher.

Moreover, in the ultraviolet light emitting element 10A of the second embodiment, the alloy containing aluminum and nickel is present in the contact surface 41 or in the vicinity of the contact surface 41 to the n-type Group III nitride semiconductor layer 20 of the first electrode layer 4. Such a first electrode layer 4 can be formed under the condition where the alloy containing aluminum and nickel is easily formed, e.g., under the condition where a high resistance alloy, such as an alloy of aluminum and gold, is harder to be formed. As a result, the formation of the high resistance alloy is reduced, and therefore a contact resistance reduction effect is obtained.

Moreover, due to the presence of the alloy containing aluminum and nickel in the contact surface 41 or in the vicinity of the contact surface 41 to the n-type nitride semiconductor layer 2 of the first electrode layer 4, the upper surface (surface on the side opposite to the contact surface 41) of the first electrode layer 4 becomes rough. In connection therewith, the adhesion of the first electrode layer 4 and the first pad electrode 6 improves, and therefore the lifetime of the ultraviolet light emitting element 10A can be longer. Although the effect can be obtained also due to the presence of aluminum in the contact surface 41 or in the vicinity of the contact surface 41, better effect is obtained when the alloy containing aluminum and nickel is present.

The thickness of the first layer (alloy layer containing aluminum and nickel) 4a of the first electrode layer 4 is preferably 100 nm or more from the viewpoint of the reduction in contact resistance and better adhesion with the first pad electrode 6 described above. Moreover, when the thickness of the first layer 4a is excessively large, the first electrode layer 4 becomes too rough to be covered by the first pad electrode 6 or the insulation layer 8 to be formed on the first electrode layer 4 which can lead to increase the risk of poor reliability. Therefore, the thickness of the first layer 4a is preferably 1000 nm or less and more preferably 600 nm or less.

From these viewpoints, the thickness of the first layer 4a of the first electrode layer 4 is set to 100 nm or more and 1000 nm or less in the ultraviolet light emitting element 10A of the second embodiment. The thickness of the first layer 4a of the first electrode layer 4 is more preferably 100 nm or more and 600 nm or less.

The thickness of the second layer (aluminum containing layer) 4b of the first electrode layer 4 is preferably 1 nm or more and more preferably 10 nm or more from the viewpoint of a reduction in contact resistance and better reflectance.

Moreover, when the thickness of the second layer 4b is too thick, the thickness of the third layer 4c becomes less, so that the second layer 4b is less covered by the third layer 4c and is easier to be exposed to oxygen and then oxidized. Therefore, from the viewpoint of avoiding the oxidation of the first electrode layer 4, the thickness of the second layer 4b is preferably 150 nm or less, more preferably 100 nm or less. From these viewpoints, the thickness of the second layer 4b of the first electrode layer 4 is set to 1 nm or more and 150 nm or less in the ultraviolet light emitting element 10A of the second embodiment. The thickness of the first layer 4b of the first electrode layer 4 is more preferably 1 nm or more and 100 nm or less.

Although this embodiment describes the example in which the nitride semiconductor light emitting element of the second aspect of the present invention is applied to the ultraviolet light emitting element, the emission wavelength is not limited to ultraviolet light.

First Example: Example of First Aspect

Example 1

The ultraviolet light emitting element 10 of the structure described in the first embodiment was produced using known materials and employing a known method, except a formation process of the first electrode layer 4.

First, the n-type nitride semiconductor layer 2 was formed on the entire surface of the substrate 1, and then the nitride semiconductor light emitting layer 32 was formed on the entire surface of the n-type nitride semiconductor layer 2. Next, the p-type nitride semiconductor layer 33 was formed on the entire surface of the nitride semiconductor light emitting layer 32. Thus, an object having stacking layers grown on the substrate 1 was obtained.

As the substrate 1, an AlN substrate was used. As the n-type nitride semiconductor layer 2, an n-type $Al_{0.7}Ga_{0.3}N$ layer containing Si as impurities was formed. As the nitride semiconductor light emitting layer 32, a light emitting layer of a multi quantum well structure comprising AlGaN (quantum well layers) and AlGaN (barrier layers) was formed. As the p-type nitride semiconductor layer 33, a p-type GaN layer containing Mg as impurities was formed.

Next, the nitride semiconductor body 3 illustrated in FIG. 2 was formed by etching the stacking layers on the substrate 1 to remove a part of the stacking layers in a plane with a predetermined depth. The etching depth is a depth at which a part of the n-type nitride semiconductor layer 2 was removed. By the etching, a part of the n-type nitride semiconductor layer 2 is exposed as viewed in plan. An unetched portion remains as the n-type nitride semiconductor layer 31 in the nitride semiconductor body 3. As an etching method, a dry etching method including inductive coupled plasma etching was applied. And then surface treatment using a mixture of sulfuric acid solution and a hydrogen peroxide solution was employed.

Next, the insulation layer was formed on the entire surface of the nitride semiconductor body 3 and the n-type nitride semiconductor layer 2 formed on the substrate 1, and then etching by BHF was performed to remove a part of the insulation layer in a plane to expose a part of the n-type nitride semiconductor layer 2.

Next, the first electrode layer 4 was formed in a region where the surface of the n-type nitride semiconductor layer 2 was exposed by BHF etching with the following method.

First, a metal stack was prepared by forming a titanium (Ti) layer, an aluminum (Al) layer, a nickel (Ni) layer, and a gold (Au) layer in this order from the n-type nitride semiconductor 2 having the planar shape of the first electrode layer 4 illustrated in FIG. 3 with thicknesses of 20 nm/130 nm/35 nm/50 nm, respectively, by vapor deposition. Next, the substrate 1 including the metal stack was placed into an RTA (Rapid Thermal Annealing) equipment to apply annealing process. The annealing process was performed for 2 minutes by holding the temperature of the substrate 1 at 850° C. with introducing 150° C. of nitrogen gas into the annealing process chamber. The temperature of the nitrogen gas was adjusted by attaching a heater to the gas line.

Next, after the first electrode layer 4 was formed, the substrate 1 was etched by BHF to expose a part of the p-type nitride semiconductor layer 33 of the nitride semiconductor body 3.

Next, the substrate 1, after a part of p-type nitride semiconductor layer 33 was exposed, was placed into a vapor deposition equipment, and a nickel (Ni) layer and a gold (Au) layer were formed in this order on the p-type nitride semiconductor 33 in the nitride semiconductor body 3 with the planar shape of the second electrode layer 5 illustrated in FIG. 3, and then known annealing process was performed to form the second electrode layer 5 on the substrate 1.

Next, another insulation layer was formed on the entire surface of the substrate including the first electrode layer 4, the insulation layer formed after dry etching, and the second electrode layer 5 on the substrate 1. And then opening portions where the first pad electrode 6 and the second pad electrode 7 to be formed were etched out in the insulation layer 8.

Next, the first pad electrode 6 and the second pad electrode 7 were deposited with a metal stack of Ti and Au by vapor deposition.

The first electrode layer 4 of the obtained ultraviolet light emitting element 10 was investigated for the total existence area ratio of an aluminum substance and an alloy containing aluminum and nickel in the contact surface 41 or in the vicinity of the contact surface 41, the aluminum substance existence area ratio in the contact surface 41 or in the vicinity of the contact surface 41, the thickness of the first layer 4a, the thickness of the second layer 4b, and the area ratio of the first layer 4a to the second layer 4b in a predetermined cross section (cross section perpendicular to the substrate 1 and along the straight line passing through the center of the substrate 1 and extending from one end of the substrate 1 to the other end as viewed in plan).

Specifically, first, a predetermined cross section perpendicular to the substrate 1 of a portion containing the first electrode layer 4 of the ultraviolet light emitting element 10 was cut out with 100 nm or less of thickness parallel to the cross section surface by an FIB (Focused Ion Beam) method using 30 kV Ga$^+$. Next, the cut-out section was observed under STEM (Scanning Transmission Electron Microscope) at an acceleration voltage of 200 kV, BF (Bright Field) and HAADF (High Angle Annular Dark Field) images of the cut-out section were obtained, and then a part of the images was analyzed by STEM-EDX (Energy Dispersive X-ray)

Furthermore, the dimensions of the aluminum substance and the alloy containing aluminum and nickel in the first electrode 4 were measured from the HAADF image based on the estimation from the STEM and STEM-EDX analysis results including the information of the type of elements contained in each region of the first electrode layer 4 by STEM-EDX and the contrast in each regions of the first electrode layer 4 in the BF and HAADF images. More specifically, a the thickness of the first layer 4a, the thickness of the second layer 4b, the length of the interface between the first layer 4a and the n-type semiconductor layer 2 in the cut-out cross section, and the length of the interface between the second layer 4b and the n-type semiconductor layer 2 in the cut-out cross section were measured. It is to be noted that when an intermediate layer with a thickness of 3 nm or less presents between the first layer 4a or the second layer 4b and the n-type semiconductor layer 2, the length of the interface between the first layer 4a and the intermediate layer and the length of the interface between the second layer 4b and the intermediate layer were measured. The existence area ratio and the cross-sectional area ratio in the contact surface 41 were calculated using the measured results. The analysis was performed with 20 µm of the first electrode 4 length along the STEM and STEM-EDX observation surface (cross section surface) and parallel to the substrate 1. The presence or absence of mixed elements other than Al and Ni at the contact surface 41 was estimated from the STEM-EDX analysis results.

To the obtained ultraviolet light emitting element 10, in the range of 100 mA to 700 mA operation current were applied, and then the forward voltages at those currents were measured. For the measurement of the forward voltages, a four-probe method was applied, so that the influence of the contact resistance between needles and an electrode was negligible. For the measured values of the obtained forward voltages, a relative value when the forward voltage at the operation current of 100 mA was set to 1 was calculated. Furthermore, the ratio of the forward voltage at 500 mA of operation current to the forward voltage at 100 mA of operation current was calculated and defined as a forward voltage increase rate.

Furthermore, the ultraviolet light emitting element 10 having a square shape with one side of 800 mµ in which the planar shape of the first electrode layer 4, the nitride semiconductor body 3, and the second electrode layer 5 are the shapes illustrated in FIG. 6 was produced by the same method as described above and each measurement described above was performed and the relative value and the increase rate of the forward voltages were calculated by the same method as described above.

Examples 2 to 7

In Examples 2 to 7, the ultraviolet light emitting elements 10 were produced by the same method as that of Example 1 except the following points, in which the planar shapes of the first electrode layer 4, the nitride semiconductor body 3, and the second electrode layer 5 were the planar shapes of the examples illustrated in FIG. 3 or FIG. 6. Specifically, any one of the substrate temperature, the nitrogen temperature, and the heating time of the annealing process conditions configuring the formation conditions of the first electrode layer 4 was changed to a value as given in Table 1 from the value in Example 1.

Examples 8 to 12

In Examples 8 to 12, the ultraviolet light emitting elements 10 were produced by the same method as that of Example 1 except the following points, in which the planar shapes of the first electrode layer 4, the nitride semiconductor body 3, and the second electrode layer 5 were the planar shapes of the examples illustrated in FIG. 3 or FIG. 6. Specifically, the metal stack configuration before annealing process of the first electrode layer 4 was set to a configuration as given in Table 1 which is different from the configuration of Example 1. The nitrogen temperature of the annealing process conditions was not controlled. The substrate temperature in Examples 9 and 10 and the heating time in Examples 11 and 10 were changed to different values from the values in Example 1 as given in Table 1.

In Example 8, first, a titanium (Ti) layer, an aluminum (Al) layer, and a nickel (Ni) layer were prepared in this order from the n-type nitride semiconductor 2 by vapor deposition with thicknesses of 20 nm/130 nm/35 nm, respectively, in the formation of the first electrode layer 4 to thereby obtain a metal stack. Next, the substrate 1 including the metal stack was placed into an RTA (Rapid Thermal Annealing) equipment to apply annealing process. The annealing process was performed for 2 minutes by holding the temperature of the substrate 1 at 850° C., with introducing nitrogen gas into the annealing process chamber but the nitrogen gas temperature was not controlled. Moreover, after the annealing process, 50 nm of Au was formed on the annealed metal stack by vapor deposition to be the first electrode layer 4.

Formation methods of the first electrode layer 4 of Examples 9 to 12 are the same as mentioned above but only difference from the method of Example 8 only is the substrate temperature or the heating time.

In Examples 8 to 12, the first electrode layer 4 was formed by such a method, and therefore the first electrode layer 4 does not contain a high resistance alloy, such as an alloy of aluminum and gold.

Examples 13 to 17

In Examples 13 to 17, the ultraviolet light emitting elements 10 were produced by the same method as that of Example 1 except the following points, in which the planar shapes of the first electrode layer 4, the nitride semiconductor body 3 and the second electrode layer 5 were the planar shapes of the examples illustrated in FIG. 3 or FIG. 6. Specifically, the substrate temperature and the heating time of the annealing process conditions configuring the formation conditions of the first electrode layer 4 were changed to values as given in Table 1 from the values in Example 1.

Examples 18 and 19

In Examples 18 and 19, the ultraviolet light emitting elements 10 were produced by the same method as that of Example 1 except the following points, in which the planar shapes of the first electrode layer 4, the nitride semiconductor body 3, and the second electrode layer 5 were the planar shapes of the examples illustrated in FIG. 3 or FIG. 6. Specifically, the metal stack configuration before annealing process of the first electrode layer 4 was set to a configuration as given in Table 1 which is different from the configuration of Example 1.

In Example 18, first, a vanadium (V) layer, an aluminum (Al) layer, a nickel (Ni) layer, and a gold (Au) layer were prepared in this order from the n-type nitride semiconductor 2 by vapor deposition with thicknesses of 20 nm/130 nm/35 nm/50 nm, respectively, in the formation of the first electrode layer 4 to thereby obtain a metal stack. Thereafter, the same annealing process as that of Example 1 was performed.

In Example 19, first, a zirconium (Zr) layer, an aluminum (Al) layer, a nickel (Ni) layer, and a gold (Au) layer were prepared in this order from the n-type nitride semiconductor 2 by vapor deposition with thicknesses of 20 nm/130 nm/35 nm/50 nm, respectively, in the formation of the first electrode layer 4, whereby a metal stack was obtained. Thereafter, the same annealing process as that of Example 1 was performed.

Comparative Example 1

In Comparative Example 1, the ultraviolet light emitting elements 10 were produced by the same method as that of Example 1 except the following points, in which the planar shapes of the first electrode layer 4, the nitride semiconductor body 3, and the second electrode layer 5 were the planar shapes of the examples illustrated in FIG. 3 or FIG. 6. Specifically, the nitrogen gas temperature was not controlled during annealing process of the first electrode layer 4 as given in Table 1.

Then, Examples 2 to 19 and Comparative Example 1 were also investigated for the total existence area ratio of an aluminum substance and an alloy containing aluminum and nickel and the existence area ratio of an aluminum substance in the contact surface 41 or in the vicinity of the contact surface 41 of the first electrode 4 by the same method as that of Example 1. Moreover, the forward voltage of the first electrode layer 4 was measured by the same method as that of Example 1 and a relative value when the forward voltage at 100 mA of operation current was set to 1 was calculated. Furthermore, the ratio of the forward voltage at 500 mA of operation current to the forward voltage at 100 mA of operation current was calculated as a forward voltage increase rate.

These measurement results and the forward voltage increase rates are given in Table 1 as well as the formation conditions of the first electrode layer 4.

In Table 1, "Al+AlNi" indicates the total existence of the aluminum substance and the alloy containing aluminum and nickel, "Al content" indicates the aluminum existence ratio, "AlNi layer" indicates the first layer 4a, and "Al containing layer" indicates the second layer 4b.

Table 1 indicates the cases where the values are satisfied with the following configurations (a) to (e) as "Yes" and the cases where the values are not satisfied with the following configurations (a) to (e) as "No".

(a) The total existence area ratio (Al+AlNi) of the aluminum substance and the alloy containing aluminum and nickel in the contact surface 41 or in the vicinity of the contact surface 41 is 60% or more.

(b) The aluminum content ratio (Al content) in the contact surface 41 or in the vicinity of the contact surface 41 is 30% by area or more.

(c) The thickness of the aluminum containing layer (Al containing layer) 4b is 1 nm or more and 150 nm or less.

(d) The thickness of the first layer (AlNi layer) 4a is 100 nm or more and 1000 nm or less.

(e) Cross-sectional area of the first layer 4a:Cross-sectional area of aluminum containing layer 4b=1:2 to 400:1 is satisfied.

When there are mixture of substrates other than Al and Ni in the contact surface and in the vicinity of the contact surface, the symbol of element of the mixture of elements is given in Table 1.

TABLE 1

| | Formation conditions of first electrode layer 4 | | | | Configuration of first electrode layer 4 | | | | | Mixed element in contact surface or in vicinity of contact surface | Element performance Drive voltage increase rate (500 mA) | |
|---|---|---|---|---|---|---|---|---|---|---|---|---|
| | | Annealing process conditions | | | Existence area ratio in contact surface 41 | | | Thickness (nm) | | | | |
| | Metal laminate configuration | Substrate temperature (° C.) | Nitrogen temperature (° C.) | Heating time (second) | Al + AlNi (% by area) | Al content (% by area) | AlNi layer 4a | Al containing layer 4b | Cross section ratio 4a/4b | | FIG. 3 | FIG. 6 |
| Ex. 1 | Ti/Al/Ni/Au | 850 | 150 | 120 | Yes | Yes | Yes | Yes | Yes | Ti, Au | 1.32 | 1.20 |
| Ex. 2 | Ti/Al/Ni/Au | 840 | 150 | 120 | Yes | Yes | Yes | Yes | Yes | Ti, Au | 1.43 | 1.30 |
| Ex. 3 | Ti/Al/Ni/Au | 950 | 150 | 120 | Yes | Yes | Yes | Yes | Yes | Au | 1.45 | 1.32 |
| Ex. 4 | Ti/Al/Ni/Au | 850 | 150 | 30 | Yes | Yes | Yes | Yes | Yes | Ti, Au | 1.36 | 1.24 |
| Ex. 5 | Ti/Al/Ni/Au | 850 | 150 | 240 | Yes | Yes | Yes | Yes | Yes | Ti, Au | 1.33 | 1.21 |
| Ex. 6 | Ti/Al/Ni/Au | 850 | 100 | 120 | Yes | Yes | Yes | Yes | Yes | Ti, Au | 1.38 | 1.25 |
| Ex. 7 | Ti/Al/Ni/Au | 850 | 300 | 120 | Yes | Yes | Yes | Yes | Yes | Ti, Au | 1.34 | 1.22 |
| Ex. 8 | Ti/Al/Ni | 850 | Not Controlled | 120 | Yes | Yes | Yes | Yes | Yes | Ti | 1.33 | 1.21 |
| Ex. 9 | Ti/Al/Ni | 840 | Not Controlled | 120 | Yes | Yes | Yes | Yes | Yes | Ti | 1.38 | 1.25 |
| Ex. 10 | Ti/Al/Ni | 950 | Not Controlled | 120 | Yes | Yes | Yes | Yes | Yes | Ti | 1.35 | 1.23 |
| Ex. 11 | Ti/Al/Ni | 850 | Not Controlled | 30 | Yes | Yes | Yes | Yes | Yes | Ti | 1.33 | 1.21 |
| Ex. 12 | Ti/Al/Ni | 850 | Not Controlled | 240 | Yes | Yes | Yes | Yes | Yes | Ti | 1.34 | 1.22 |
| Ex. 13 | Ti/Al/Ni/Au | 900 | 150 | 10 | Yes | Yes | Yes | Yes | Yes | Ti, Au | 1.31 | 1.19 |
| Ex. 14 | Ti/Al/Ni/Au | 920 | 150 | 10 | Yes | Yes | Yes | Yes | Yes | Ti, Au | 1.31 | 1.19 |
| Ex. 15 | Ti/Al/Ni/Au | 940 | 150 | 10 | Yes | Yes | Yes | Yes | Yes | Ti, Au | 1.32 | 1.20 |
| Ex. 16 | Ti/Al/Ni/Au | 920 | 150 | 5 | Yes | Yes | Yes | Yes | Yes | Ti, Au | 1.32 | 1.20 |
| Ex. 17 | Ti/Al/Ni/Au | 920 | 150 | 15 | Yes | Yes | Yes | Yes | Yes | Ti, Au | 1.32 | 1.20 |
| Ex. 18 | V/Al/Ni/Au | 850 | 150 | 120 | Yes | Yes | Yes | Yes | Yes | V, Au | 1.32 | 1.20 |
| Ex. 19 | Zr/Al/Ni/Au | 850 | 150 | 120 | Yes | Yes | Yes | Yes | Yes | Zr, Au | 1.32 | 1.20 |
| Comp. Ex. 1 | Ti/Al/Ni/Au | 850 | Not Controlled | 120 | No | No | No | No | No | Ti, Au | 1.51 | 1.44 |

Figure 9:
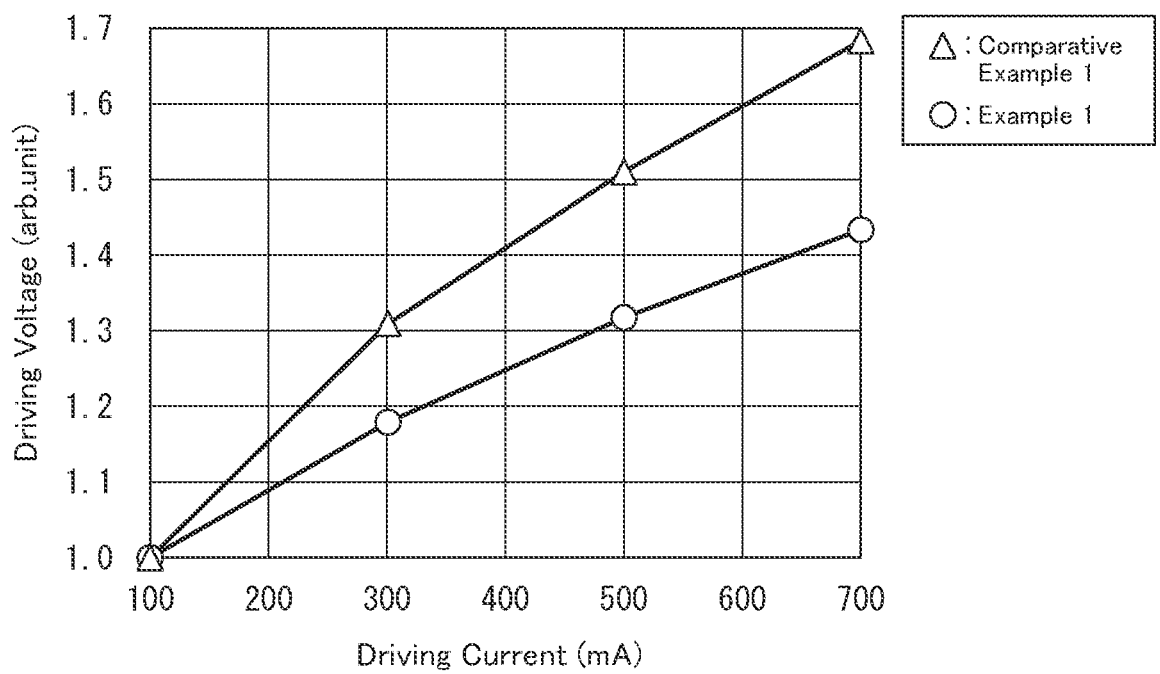
FIG. 9 is a graph illustrating results obtained when the first electrode layer, the nitride semiconductor body, and the second electrode layer have the planar shapes of FIG. 3 in Example 1 in the first embodiment.
Figure 10:
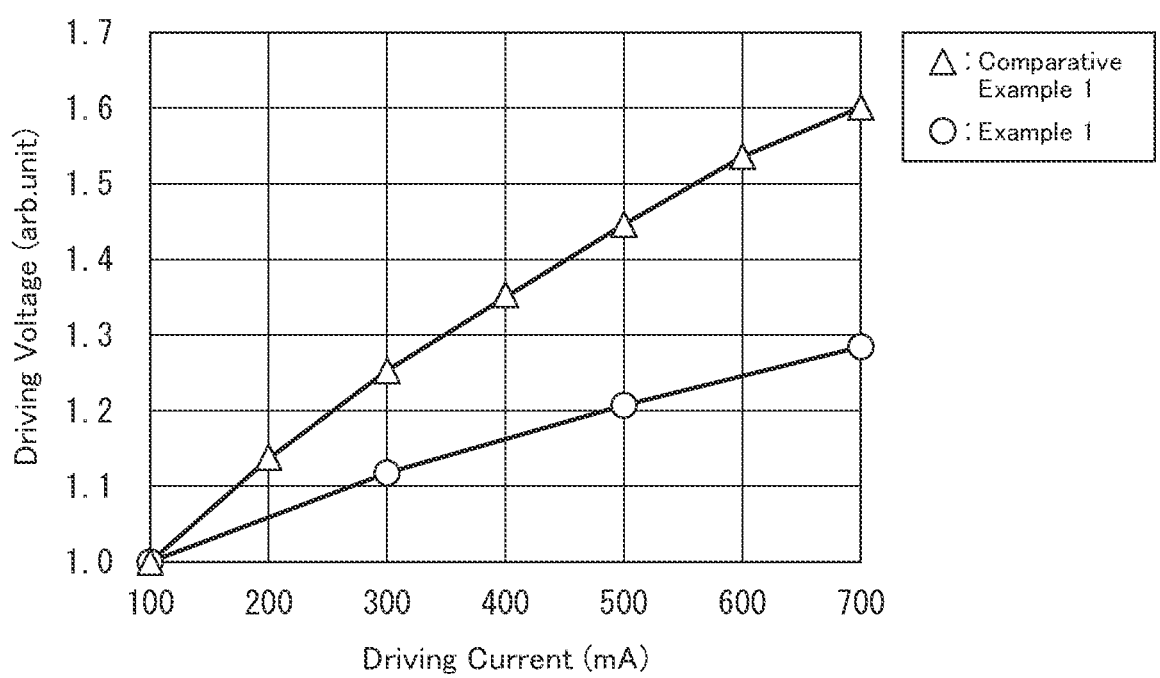
FIG. 10 is a graph illustrating results obtained when the first electrode layer, the nitride semiconductor body, and the second electrode layer have the planar shapes of FIG. 6 in Example 1 in the first embodiment.

Further, with respect to Example 1 and Comparative Example 1, FIG. 9 illustrates a chart of the relationship between the operation current and the forward voltage (relative value) when the planar shape of the first electrode layer 4, the nitride semiconductor body 3, and the planar shape of the second electrode layer 5 are the shapes illustrated in FIG. 3 and FIG. 10 illustrates a chart of the relationship between the operation current and the forward voltage (relative value) when the planar shape of the first electrode layer 4 and the planar shape of the second electrode layer 5 are the shapes illustrated in FIG. 6.

In Table 1, the forward voltage increase rates of the ultraviolet light emitting elements 10 of Examples 1 to 19 are lower than the forward voltage increase rate of the ultraviolet light emitting element of Comparative Example 1. The forward voltage increase rate becomes larger when the contact resistance is higher, which means that, when the forward voltage increase rate is lower, the contact resistance is lower. Therefore, it is found from the results of Table 1 that the contact resistance is lower in the ultraviolet light emitting elements 10 of Examples 1 to 19 than in the ultraviolet light emitting element of Comparative Example 1.

Moreover, it is found from the graphs of FIG. 9 and FIG. 10 that the increment of the forward voltage with the operation current increase in the ultraviolet light emitting element 10 of Example 1 is lower than that of the ultraviolet light emitting element of Comparative Example 1 (The slope of Comparative Example 1 is steeper). More specifically, it is found that the contact resistance reduction effect is greater when the operation current is high in the ultraviolet light emitting element 10 of Example 1 than in the ultraviolet light emitting element of Comparative Example 1.

Furthermore, it is found from the comparison between the graph of FIG. 9 and the graph of FIG. 10 that, also in the ultraviolet light emitting element 10 of Example 1 and the ultraviolet light emitting element of Comparative Example 1, the forward voltage (i.e., contact resistance) at the same operation current is further reduced in the case where the planar shapes of the first electrode layer 4, the nitride semiconductor body 3, and the second electrode layer 5 are the shapes illustrated in FIG. 6 than in the case where the shapes are the shapes illustrated in FIG. 3. This is the effect obtained because the perimeter of the first electrode layer 4, the nitride semiconductor body 3, and the second electrode layer 5 as viewed in plan is longer in the example of FIG. 6 than in the example of FIG. 3. This means that it is preferable to design an element having a long perimeter in terms of reducing the contact resistance. On the other hand, compared with the ultraviolet light emitting element of Comparative Example 1 in FIG. 10 (i.e., the planar shapes of the first electrode layer 4, the nitride semiconductor body 3, and the second electrode layer 5 are the shapes illustrated in FIG. 6) and the ultraviolet light emitting element 10 of Example 1 in FIG. 9 (i.e., the planar shapes of the first electrode layer 4, the nitride semiconductor body 3, and the second electrode layer 5 are the shapes illustrated in FIG. 3), it is found that the forward voltage (i.e., contact resistance) at the same operation current is further reduced in the ultraviolet light emitting element 10 of Example 1.

This means that the drive voltage reduction effect obtained by the above element design only to longer the perimeter is not sufficient, and much drive voltage reduction effect can be obtained when the first electrode layer 4 satisfies the above configurations (a) to (e).

Second Example: Example of Second Aspect

<Test 1: No. 1-1 to No. 1-50>

The ultraviolet light emitting elements 10A each having the structure described in the second embodiment and having the following configuration were produced.

The substrate 1 is an AlN substrate. The n-type Group III nitride semiconductor layer 20 and n-type Group III nitride semiconductor layer 31 are n-type $Al_{0.7}Ga_{0.3}N$ layers containing Si as impurities. The total thickness (i.e., thickness of the n-type Group III nitride semiconductor layer between the substrate 1 and the Group III nitride semiconductor active layer 320) of the n-type Group III nitride semiconductor layer 20 and the n-type Group III nitride semiconductor layer 310 is 500 nm. The Group III nitride semiconductor active layer 320 has a multi quantum well structure in which a 6.5 nm thick $Al_{0.78}Ga_{0.22}N$ (barrier layers) and a 2.5 nm thick $Al_{0.52}Ga_{0.48}N$ (quantum well layers) are alternately grown with five layers. The carrier blocking layer 330 is an $Al_xGa_{(1-x)}N$ layer. The Al composition x and the film thickness are changed as given in Table 1 and 2.

The graded layer 340 is an $Al_yGa_{(1-y)}N$ layer and is a layer in which the Al composition y continuously changes from 0.75 to 0.25 from the carrier blocking layer 330 toward the p-type Group III nitride semiconductor layer 350. The p-type Group III nitride semiconductor layer 350 is a p-type GaN layer containing $4.2 \times 10^{20}$ cm$^{-3}$ of Mg as impurities.

The first electrode layer 4 contains Ti, Al, Ni, and Au. Both aluminum substance and an alloy containing aluminum and nickel are present in the contact surface 41 and in the vicinity of the contact surface 41 or in the vicinity of the contact surface 41 to the n-type Group III nitride semiconductor layer 20. The second electrode layer 5 is Ni/Au. The first pad electrode 6 and the second pad electrode 7 each have a metal stack of Ti and Au.

Each element of the above-described configuration was produced and evaluated by the following methods.

First, a 500 nm thick Si-doped $Al_{0.7}Ga_{0.3}N$ layer, the multi quantum well structure, the carrier blocking layer 330 with $Al_xGa_{(1-x)}N$ (x and the film thickness are the values of Table 1 and 2), the graded layer 340 with $Al_yGa_{(1-y)}N$ (in which the Al composition y was continuously changed from 0.75 to 0.25 and which was laminated with a film thickness of 40 nm) graded layer 340, and a p-type GaN layer containing $4.20 \times 10^{20}$ cm$^{-3}$ of Mg as impurities and having a thickness of 10 nm were grown in this order on the entire surface of an AlN substrate by an MOCVD method. Thus, an object having stacking layers grown on the substrate 1 was obtained. As raw materials, triethylgallium (TEGa), trimethylaluminum (TMAl), ammonia (NH$_3$), monosilane (SiH$_4$), and biscyclopentadienyl magnesium (Cp$_2$Mg) were used. The Al compositions of the layers were individually controlled by controlling the supply ratio of the triethylgallium (TEGa) and the trimethylaluminum (TMAl). The film thickness was controlled by changing the growth time. During the growth, the substrate temperature was controlled to 1100° C., the growth pressure was controlled to 50 hPa, and the raw material supply ratio (V/III ratio) was set to 3000, and here NH$_3$ is used as the Group V raw material and triethylgallium and/or trimethylaluminum is as the Group III raw material.

the Al composition and the lattice relaxation rate of the n-type Group III nitride semiconductor layer 20 were individually measured by X-ray diffraction reciprocal space mapping in the vicinity of the (10-15) plane and the lattice relaxation rate was 0%. The Al composition of each layer other than the n-type Group III nitride semiconductor layer 20 was quantified by EELS measurement on a part of stacking layers of light emitting element structures.

The Si concentration of the n-type Group III nitride semiconductor layer 20 and the Mg concentration of the p-type GaN layer were individually quantified by SIMS measurement. Although the details are described later, the film thickness of each layers was measured by cross-sectional observation by a transmission electron microscope (TEM).

Next, the nitride semiconductor body 30 illustrated in FIG. 7 was formed by etching the stacking layers on the substrate 1 to remove a part of the stacking layers in a plane with a predetermined depth. The etching depth is the depth at which a part of the n-type Group III nitride semiconductor layer 20 was removed. By the etching, a part of the n-type Group III nitride semiconductor layer 20 is exposed as viewed in plan. An unetched portion remains as the n-type Group III nitride semiconductor layer 310 in the nitride semiconductor body 30. As an etching method, a dry etching method including inductive coupled plasma etching was applied. And then surface treatment using a mixture of sulfuric acid solution and a hydrogen peroxide solution was employed.

Next, the insulation layer was formed on the entire surface of the nitride semiconductor body 3 and the n-type Group III nitride semiconductor layer 20 formed on the substrate 1, and then etching by BHF was performed to remove a part of the insulation layer in a plane to expose a part of the n-type Group III nitride semiconductor layer 20.

Next, the first electrode layer 4 was formed in a region where the surface of the n-type Group III nitride semiconductor layer 20 was exposed by BHF etching with the following method.

First, a metal stack was prepared by forming a titanium (Ti) layer, an aluminum (Al) layer, a nickel (Ni) layer, and a gold (Au) layer in this order from the n-type Group III nitride semiconductor layer 20 in the planar shape of the first electrode layer 4 illustrated in FIG. 8 with thicknesses of 20 nm/130 nm/35 nm/50 nm, respectively, by vapor deposition. Next, the substrate 1 including the metal stack was placed into an RTA (Rapid Thermal Annealing) equipment to apply annealing process.

The different annealing process conditions were applied based on the Al included ratio in the contact surface 41 and in the vicinity of the contact surface 41. Here, the Al included ratio means the total amount ratio of a simple substance aluminum and an alloy containing aluminum and nickel (Al+AlNi) in the example of the first aspect. For example, in No. 1-1 to No. 1-9 in which the Al included ratio was set to 90%, the annealing process was performed for 2 minutes by holding the temperature of the substrate 1 at 850° C. with introducing 150° C. of nitrogen gas into the annealing process chamber. The temperature of the nitrogen gas was adjusted by attaching a heater to the gas line.

Next, after the first electrode layer 4 was formed, the substrate 1 was etched by BHF to expose a part of the p-type Group III nitride semiconductor layer 350 of the nitride semiconductor body 30.

Next, the substrate 1, after a part of the p-type Group III nitride semiconductor layer 350 was exposed, was placed into a vapor deposition equipment, a nickel (Ni) layer and a gold (Au) layer were formed in this order on the p-type Group III nitride semiconductor layer 350 in the nitride semiconductor body 3 with the planar shape of the second electrode layer 5 illustrated in FIG. 8, and then known annealing process was performed to form the second electrode layer 5 on the substrate 1.

Next, another insulation layer was formed on the entire surface of the substrate 1 including the first electrode layer 4, the insulation layer formed after dry etching, and the second electrode layer 5 on the substrate 1. And then opening portions where the first pad electrode 6 and the second pad electrode 7 to be formed were etched out in the insulation layer.

Next, the first pad electrode 6 and the second pad electrode 7 were deposited with a metal stack of Ti and Au by vapor deposition.

Figure 12:
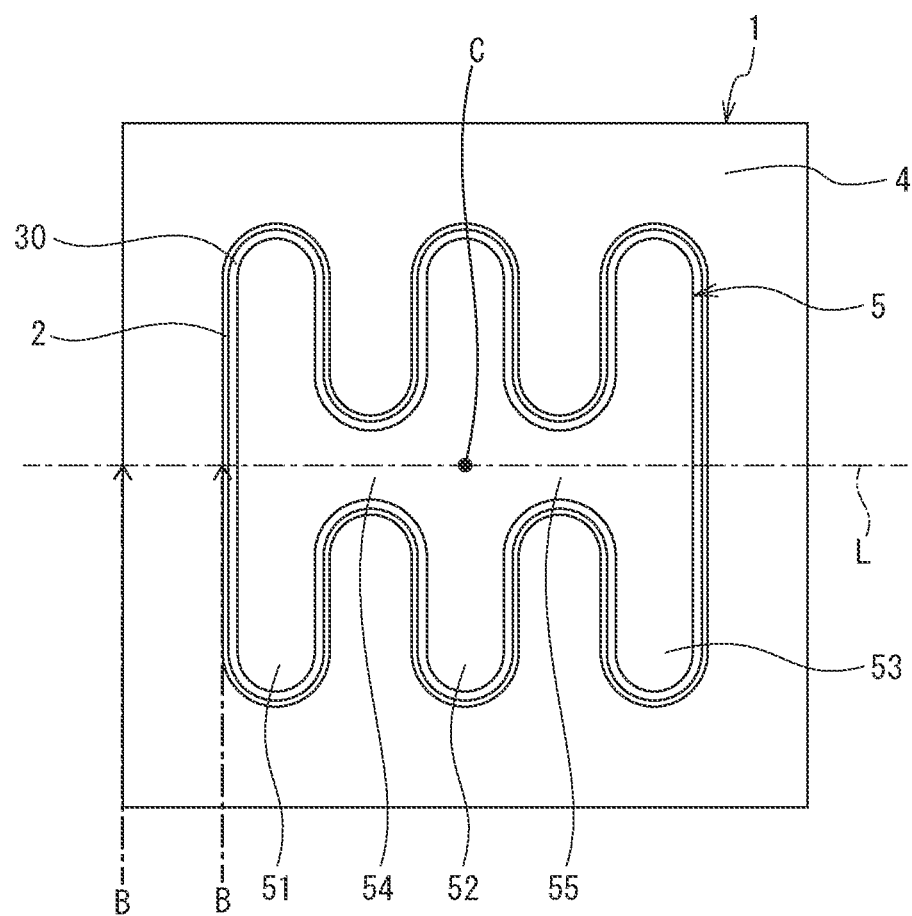
FIG. 12 is a plan view illustrating a state before pad electrodes and insulation layers are formed in a nitride semiconductor element in which the first electrode layer, the nitride semiconductor body, and the second electrode layer have planar shapes different from those of FIG. 8.

Furthermore, the ultraviolet light emitting elements 10A in which the planar shape of the first electrode layer 4, the nitride semiconductor body 3, and the planar shape of the second electrode layer 5 are the shapes illustrated in FIG. 12 were produced by the same method as described above.

In the obtained ultraviolet light emitting elements 10A, the thickness of each layer and Al included ratio in the contact surface 41 and in the vicinity of the contact surface 41 in the first electrode layer 4 were investigated by the following methods.

First, a predetermined cross section perpendicular to the substrate 1 of a portion containing the first electrode layer 4 of the ultraviolet light emitting element 10A was cut out with a thickness parallel to the substrate 1 in 100 nm or less by an FIB (Focused Ion Beam) method using 30 kV Ga⁺. Next, the cut-out section was observed under STEM (Scanning Transmission Electron Microscope) at an acceleration voltage of 200 kV, BF (Bright Field) and HAADF (High Angle Annular Dark Field) images of the cut-out section were obtained, and then a part of the images was analyzed by STEM-EDX (Energy Dispersive X-ray).

Furthermore, the dimensions of the aluminum substance and the alloy containing aluminum and nickel in the first electrode 4 were measured from the HAADF image based on the estimation from the STEM and STEM-EDX analysis results including the information of the type of elements contained in each regions of the first electrode layer 4 by STEM-EDX and the contrast in each regions of the first electrode layer 4 in the BF and HAADF images. More specifically, the length of the entire first electrode layer 4 in the cut-out cross section and the 2 lengths of the interfaces; the first one is between the first layer 4a and the n-type Group III nitride semiconductor layer 20 and the second one is the interface between the second layer 4b and the n-type Group III nitride semiconductor layer 20 in the cut-out cross section were measured. The Al included ratio (area ratio) in the contact surface 41 or in the vicinity of the contact surface 41 was calculated using the measured results. The analysis was performed with 20 um of the first electrode 4 length along the STEM and STEM-EDX observation surface (cross section surface) and parallel to the substrate 1.

Operation currents of 100 mA and 500 mA were applied to the obtained ultraviolet light emitting elements 10A, and then the forward voltages at those currents were measured. For the measurement of the forward voltage, a four-probe method was applied, so that the influence of the contact resistance between needles and an electrode was negligible. For the measured values of the obtained forward voltages, a relative value when the forward voltage at 100 mA of the operation current was set to 1 was calculated as the forward voltage increase rate. Furthermore, 350 mA of operation current was applied to the ultraviolet light emitting element 10A to measure the optical power output. As a result, light emission having a peak wavelength at around 270 nm was obtained.

Figure 11:
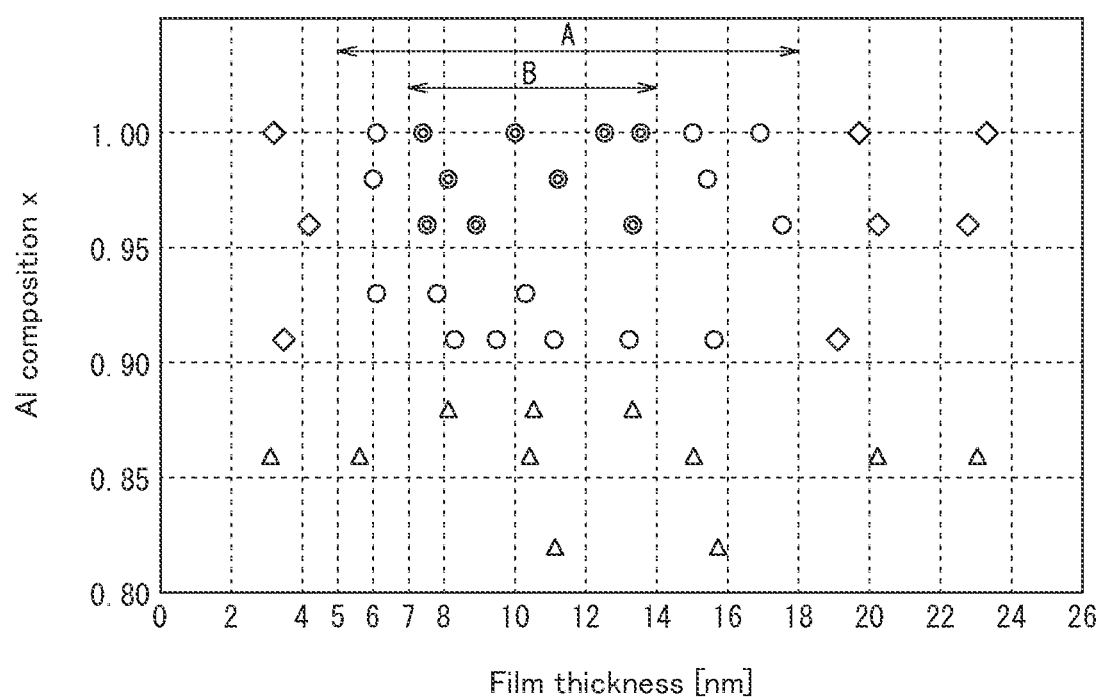
FIG. 11 is a map of Al composition and film thickness of an carrier blocking layer consists of $Al_xGa_{(1-x)}N$ layer for an ultraviolet light emitting element produced in a second embodiment.

The relative value (value when the value of No. 1-2 was set to 1) of the optical power output and the forward voltage increase rate are given in the following Tables 2 and 3 as well as the configuration of each of the ultraviolet light emitting elements 10A. Moreover, FIG. 11 illustrates the map of the Al composition and the film thickness of the $Al_xGa_{(1-x)}N$ layer as the carrier blocking layers 330 with respect to the ultraviolet light emitting elements 10A of No. 1-1 to No. 1-50.

TABLE 2

| | Configuration | | Performance | | |
|---|---|---|---|---|---|
| | Carrier blocking layer $Al_xGa_{(1-x)}N$ | Al included ration in contact surface 41 and in the vicinity of the contact surface 41 of first electrode layer | | Forward voltage increase rate | |
| No. | X | Film thickness [nm] | [%] | Optical power output (Relative value) | FIG. 12 | FIG. 8 |
| 1-1 | 1.00 | 7.4 | 90 | 0.97 | 1.21 | 1.33 |
| 1-2 | 1.00 | 10.0 | 90 | 1.00 | 1.20 | 1.32 |
| 1-3 | 1.00 | 12.5 | 90 | 0.96 | 1.20 | 1.32 |
| 1-4 | 1.00 | 13.5 | 90 | 0.92 | 1.20 | 1.32 |
| 1-5 | 0.98 | 8.1 | 90 | 0.94 | 1.21 | 1.33 |
| 1-6 | 0.98 | 11.2 | 90 | 0.99 | 1.20 | 1.32 |
| 1-7 | 0.96 | 7.5 | 90 | 0.90 | 1.21 | 1.33 |
| 1-8 | 0.96 | 8.9 | 90 | 0.95 | 1.21 | 1.33 |
| 1-9 | 0.96 | 13.3 | 90 | 0.90 | 1.20 | 1.32 |
| 1-10 | 1.00 | 6.1 | 80 | 0.87 | 1.24 | 1.36 |
| 1-11 | 1.00 | 15.0 | 80 | 0.88 | 1.21 | 1.33 |
| 1-12 | 1.00 | 16.9 | 80 | 0.81 | 1.21 | 1.33 |
| 1-13 | 0.98 | 6.0 | 80 | 0.85 | 1.24 | 1.36 |
| 1-14 | 0.98 | 15.4 | 80 | 0.86 | 1.21 | 1.33 |
| 1-15 | 0.96 | 17.5 | 80 | 0.78 | 1.21 | 1.33 |
| 1-16 | 0.93 | 6.1 | 80 | 0.78 | 1.24 | 1.36 |
| 1-17 | 0.93 | 7.8 | 80 | 0.84 | 1.22 | 1.35 |
| 1-18 | 0.93 | 10.3 | 80 | 0.89 | 1.21 | 1.33 |
| 1-19 | 0.91 | 8.3 | 80 | 0.81 | 1.22 | 1.35 |
| 1-20 | 0.91 | 9.5 | 80 | 0.87 | 1.21 | 1.33 |
| 1-21 | 0.91 | 11.1 | 80 | 0.89 | 1.21 | 1.33 |
| 1-22 | 0.91 | 13.2 | 80 | 0.88 | 1.21 | 1.33 |
| 1-23 | 0.91 | 15.6 | 80 | 0.83 | 1.21 | 1.33 |

TABLE 2-continued

| | Configuration | | | Performance | |
|---|---|---|---|---|---|
| | Carrier blocking layer $Al_xGa_{(1-x)}N$ | | Al included ration in contact surface 41 and in the vicinity of the contact surface 41 of first electrode layer | | Forward voltage increase rate |
| No. | X | Film thickness [nm] | [%] | Optical power output (Relative value) | FIG. 12 FIG. 8 |
| 1-24 | 1.00 | $\overline{3.2}$ | 75 | 0.68 | 1.25 1.37 |
| 1-25 | 1.00 | $\overline{19.7}$ | 75 | 0.72 | 1.22 1.35 |
| 1-26 | 1.00 | $\overline{23.3}$ | 75 | 0.69 | 1.22 1.35 |
| 1-27 | 0.96 | $\overline{4.2}$ | 75 | 0.74 | 1.25 1.37 |
| 1-28 | 0.96 | $\overline{20.2}$ | 75 | 0.67 | 1.22 1.35 |
| 1-29 | 0.96 | $\overline{22.8}$ | 75 | 0.63 | 1.22 1.35 |
| 1-30 | 0.91 | $\overline{3.5}$ | 75 | 0.66 | 1.25 1.37 |
| 1-31 | 0.91 | $\overline{19.1}$ | 75 | 0.64 | 1.22 1.35 |

TABLE 3

| | Configuration | | | Performance | |
|---|---|---|---|---|---|
| | Carrier blocking layer $Al_xGa_{(1-x)}N$ | | Al existence ration in contact surface 41 and the vicinity of the contact surface 41 of first electrode layer | Optical power output (Relative value) | Forwar voltage increase rate |
| No. | X | Film thickness [nm] | [%] | | FIG. 12 FIG. 8 |
| 1-32 | 0.96 | 7.5 | 65 | $\overline{0.90}$ | 1.23 1.36 |
| 1-33 | 0.96 | 8.9 | 65 | $\overline{0.94}$ | 1.22 1.34 |
| 1-34 | 1.00 | 10.0 | *50* | $\overline{0.97}$ | 1.25 1.38 |
| 1-35 | 0.91 | $\overline{3.5}$ | *50* | 0.66 | 1.26 1.39 |
| 1-36 | 0.93 | 10.3 | *50* | $\overline{0.88}$ | 1.25 1.38 |
| 1-37 | $\underline{0.88}$ | 8.1 | 80 | $\overline{0.45}$ | 1.20 1.32 |
| 1-38 | $\underline{0.88}$ | 10.5 | 80 | $\overline{0.54}$ | 1.20 1.32 |
| 1-39 | $\underline{0.88}$ | 13.3 | 80 | $\overline{0.58}$ | 1.20 1.32 |
| 1-40 | $\underline{0.86}$ | $\overline{23.0}$ | 80 | $\overline{0.38}$ | 1.20 1.32 |
| 1-41 | $\underline{0.86}$ | $\overline{3.1}$ | 80 | $\overline{0.22}$ | 1.21 1.33 |
| 1-42 | $\underline{0.86}$ | 5.6 | 80 | $\overline{0.29}$ | 1.21 1.33 |
| 1-43 | $\underline{0.86}$ | 10.4 | *50* | $\overline{0.43}$ | 1.25 1.38 |
| 1-44 | $\underline{0.86}$ | 15.0 | *50* | $\overline{0.58}$ | 1.25 1.38 |
| 1-45 | $\underline{0.86}$ | $\overline{20.2}$ | *50* | $\overline{0.45}$ | 1.25 1.38 |
| 1-46 | $\underline{0.82}$ | 11.1 | *50* | $\overline{0.25}$ | 1.25 1.38 |
| 1-47 | $\underline{0.82}$ | 15.7 | *50* | $\overline{0.27}$ | 1.25 1.38 |
| 1-48 | 1.00 | 10.0 | *40* | $\overline{0.97}$ | 1.30 1.43 |
| 1-49 | 0.91 | $\overline{3.5}$ | *40* | 0.66 | 1.31 1.44 |
| 1-50 | 0.93 | 10.3 | *40* | $\overline{0.88}$ | 1.30 1.43 |

In the column of the configuration of each of Table 2 and 3, the numerical values with underscore mean out of the range of "The Al composition x of the $Al_xGa_{(1-x)}N$ layer as the carrier blocking layer 330 is 0.90≤x≤1.00" which is the indispensable requirement of the second aspect of the present invention. The numerical values with upper line mean out of the range of "The film thickness of the carrier blocking layer 330 is 5 nm or more and 18 nm or less" which is a preferable aspect of the present invention. The numerical values in Italic mean out of the range of "The Al included ratio in the contact surface 41 or in the vicinity of the contact surface 41 of the first electrode layer is 60% by area or more" which is a preferable aspect of the present invention although the first electrode layer 4 in all the examples meet "both aluminum substance and alloy containing aluminum and nickel are present in the contact surface 41 and in the vicinity of the contact surface 41."

In the column of the performance of each of Table 2 and 3, the numerical values with underscore and with upper line mean out of the range of "0.62 or more" and "0.75 or more", respectively, which considered as good and preferable optical power output (Relative value). A preferable forward voltage increase rate is in the range of 1.4 or less when a planar shape of the first electrode 4, the nitride semiconductor body 3, and the second electrode 5 illustrated in FIG. 12. and 1.5 or less when a planar shape of the first electrode 4, the nitride semiconductor body 3, and the second electrode 5 illustrated in FIG. 8.

The elements described in No. 1-1 to No. 1-36 and No. 1-48 to 50 in Tables 2 and 3 satisfies the Al composition x of the $Al_xGa_{(1-x)}N$ layer as the carrier blocking layer 330 of 0.90≤x≤1.00 and the Al included ratio in the contact surface 41 and in the vicinity of the contact surface 41 of the first electrode layer of 40% by area or more. Therefore, good optical power outputs of 0.62 or more are obtained in both of the case where the planar shapes of the first electrode layer 4, the semiconductor body 3, and the second electrode layer 5 are the shapes of FIG. 8 and FIG. 12. Moreover, in both of the case of FIG. 6 and FIG. 12, the forward voltage increase rates meet the preferable values meaning 1.4 or less for FIG. 12 and 1.5 or less for FIG. 8.

Among the above, the elements of No. 1-1 to No. 1-23 satisfy the Al included ratio in the contact surface 41 and in the vicinity of the contact surface 41 of the first electrode layer of 50% by area or more and the film thickness of the carrier blocking layer 330 of 5 nm or more and 18 nm or less (A of FIG. 11). Therefore, good forward voltage increase rates and higher optical power outputs of 0.75 or more are obtained in both of the case where the planar shapes of the first electrode layer 4, the nitride semiconductor body 3, and the second electrode layer 5 are the shapes of FIG. 8 and FIG. 12.

The elements of No. 1-1 to No. 1-9 have the Al composition x of the carrier blocking layer 330 of 0.95 or more, the film thickness of 7 nm or more and 14 nm or less (B of FIG. 11), and an optical power output of 0.90 or more is obtained. More specifically, it is found that the optical power output can be further increased by setting that Al composition x of the carrier blocking layer 330 to 0.95 or more and the film thickness to 7 nm or more and 14 nm or less.

<Test 2: No. 2-1 to No. 2-15>

The ultraviolet light emitting elements 10A each having the structure described in the second embodiment and having the same configuration as that of the test 1 except the following points were produced. As the carrier blocking layer 330, an AlN layer having a film thickness of 10 nm was used, the Al included ratio in the contact surface 41 and in the vicinity of the contact surface 41 of the first electrode layer was set to 80% by area, and the film thickness of the graded layer 340 was varied. More specifically, the elements of No. 2-1 to No. 2-15 satisfy the Al composition x of the $Al_xGa_{(1-x)}N$ layer as the carrier blocking layer 330 of $0.90 \leq x \leq 1.00$ and the Al included ratio in the contact surface 41 and in the vicinity of the contact surface 41 of the first electrode layer of 70% by area or more.

Operation currents of 100 mA and 500 mA were applied to the obtained ultraviolet light emitting element 10A of No. 2-1 to No. 2-15, and then the forward voltages at the currents were measured. For the measured values of the obtained forward voltages, a relative value when the forward voltage at the 100 mA of operation current was set to 1 was calculated as the forward voltage increase rate. Furthermore, 350 mA of operation current was applied to the ultraviolet light emitting element 10A to measure the optical power output. As a result, light emission having a peak wavelength at around 270 nm was obtained. The relative value (value when the value of No. 1-2 was set to 1) of the optical power output and the forward voltage increase rate are given as well as the configuration of the ultraviolet light emitting elements 10A in the following table 4.

TABLE 4

| | Configuration Film thickness of graded layer [nm] | Performance | | |
|---|---|---|---|---|
| | | Optical power output (Relative value) | Forward voltage increase rate | |
| | | | FIG. 12 | FIG. 8 |
| 2-1 | 0 | 0.64 | 1.23 | 1.35 |
| 2-2 | 3 | 0.74 | 1.23 | 1.35 |
| 2-3 | 5 | 0.79 | 1.23 | 1.35 |
| 2-4 | 10 | 0.88 | 1.21 | 1.34 |
| 2-5 | 15 | 0.93 | 1.21 | 1.34 |

TABLE 4-continued

| | Configuration Film thickness of graded layer [nm] | Performance | | |
|---|---|---|---|---|
| | | Optical power output (Relative value) | Forward voltage increase rate | |
| | | | FIG. 12 | FIG. 8 |
| 2-6 | 20 | 0.96 | 1.21 | 1.34 |
| 2-7 | 30 | 1.00 | 1.20 | 1.32 |
| 2-8 | 40 | 1.00 | 1.21 | 1.34 |
| 2-9 | 50 | 0.99 | 1.20 | 1.32 |
| 2-10 | 70 | 0.95 | 1.20 | 1.32 |
| 2-11 | 90 | 0.92 | 1.21 | 1.34 |
| 2-12 | 110 | 0.83 | 1.21 | 1.34 |
| 2-13 | <u>130</u> | <u>0.73</u> | 1.21 | 1.34 |
| 2-14 | <u>140</u> | <u>0.68</u> | 1.21 | 1.34 |
| 2-15 | <u>200</u> | <u>0.63</u> | 1.28 | 1.41 |

In the column of the configuration of Table 4, the numerical values with upper line mean out of the range of "The film thickness of the graded layer 340 is 5 nm or more and 110 nm or less" which is a preferable aspect of the second embodiment of the present invention. In the column of the performance of Table 4, the numerical values with upper line mean out of the range of "0.75 or more" which considered as a preferable optical power output value (Relative value). In the column of the performance of Table 4, when the both case of planar shapes of the first electrode layer 4, the nitride semiconductor body 3, and the second electrode layer 5 are the shapes of FIG. 12 and FIG. 8, there were no numerical values out of the range of a good forward voltage increase rate meaning "1.4 or less" for FIG. 12 and "1.5 or less" for FIG. 8.

It is found from the results of Table 4 that the film thickness of the graded layer 340 of the elements of No. 2-1 to No. 2-15 is 0 nm or more and 200 nm or less. When both of the case of planar shapes of the first electrode layer 4, the nitride semiconductor body 3, and the second electrode layer 5 are the shapes of FIG. 12 and FIG. 8, a good optical power output of 0.62 or more is obtained at a forward voltage increase rate of 1.4 or less for FIG. 12 and 1.5 or less for FIG. 8. Among the above, in the elements of No. 2-3 to No. 2-12 having a film thickness of the graded layer 340 in the range of 5 nm or more and 110 nm or less, a higher optical power output of 0.75 or more is obtained at a forward voltage increase rate of 1.4 or less for FIG. 12 and 1.5 or less for FIG. 8. More specifically, it is found that the optical power output can be increased with the graded layer 340 having a film thickness of 5 nm or more and 110 nm or less.

When the film thickness is in the range of 15 nm or more and 90 nm or less, an optical power output of 0.90 or more is obtained. When the film thickness is in the range of 20 nm or more and 70 nm or less, an optical power output of 0.93 or more is obtained. More specifically, it is found that the film thickness of the graded layer 340 is more preferably 15 nm or more and 90 nm or less and still more preferably 20 nm or more and 70 nm or less.

<Test 3: No. 3-1 to No. 3-10>

The ultraviolet light emitting elements 10A each having the structure described in the second embodiment and having the same configuration as that of the test 1 except the following points were produced. For the carrier blocking layer 330, an AlN layer having a film thickness of 10 nm was used, the Al included ratio in the contact surface 41 and in the vicinity of the contact surface 41 of the first electrode layer was set to the 80% by area, and the p-type Group III nitride semiconductor layer 350 is a GaN layer (film thickness of 10 nm) containing Mg as impurities, in which the Mg concentration was varied. More specifically, the elements of No. 3-1 to No. 3-10 satisfy the Al composition x of the $Al_xGa_{(1-x)}N$ layer for the carrier blocking layer 330 of $0.90 \leq x \leq 1.00$ and the Al included ratio in the contact surface 41 and in the vicinity of the contact surface 41 of the first electrode layer of 70% by area or more.

Operation currents of 100 mA and 500 mA were applied to the obtained ultraviolet light emitting elements 10A of No. 3-1 to No. 3-10 in the same manner as described above, and then the forward voltages at the currents were measured. For the measured values of the obtained forward voltages, a relative value when the forward voltage at 100 mA of the operation current was set to 1 was calculated as the forward voltage increase rate. Furthermore, 350 mA of operation current was applied to the ultraviolet light emitting element 10A to measure the optical power output. As a result, light emission having a peak wavelength at around 270 nm was obtained. The relative value (value when the value of No. 1-2 was set to 1) of the optical power output and the value of the forward voltage increase rate are given as well as the configuration of the ultraviolet light emitting elements 10A of No. 3-1 to No. 3-10 in the following table 5.

TABLE 5

| No. | Configuration Mg concentration of second Group III nitride semiconductor layer [cm$^{-3}$] | Performance Optical power output (Relative value) | Drive voltage increase rate FIG. 12 | FIG. 8 |
|---|---|---|---|---|
| 3-1 | 2.10E+19 | 0.94 | 1.33 | 1.47 |
| 3-2 | 6.30E+19 | 0.95 | 1.30 | 1.43 |
| 3-3 | 1.10E+20 | 0.97 | 1.23 | 1.36 |
| 3-4 | 2.10E+20 | 1.00 | 1.22 | 1.34 |
| 3-5 | 4.20E+20 | 0.98 | 1.22 | 1.34 |
| 3-6 | 5.25E+20 | 0.98 | 1.20 | 1.32 |
| 3-7 | 7.60E+20 | 1.00 | 1.23 | 1.36 |
| 3-8 | 9.45E+20 | 0.95 | 1.28 | 1.41 |
| 3-9 | 1.26E+21 | 0.91 | 1.30 | 1.43 |
| 3-10 | 1.52E+21 | 0.89 | 1.30 | 1.43 |

In the column of the configuration of Table 5, the numerical values with upper line mean out of the range of "The Mg concentration is $1 \times 10^{20}$ cm$^{-3}$ or more and less than $8 \times 10^{20}$ cm$^{-3}$" which is a preferable aspect of the second embodiment of the present invention. A preferable forward voltage increase rate is in the range of 1.4 or less when a planar shape of the first electrode 4, the nitride semiconductor body 3, and the second electrode 5 illustrated in FIG. 12. and 1.5 or less when a planar shape of the first electrode 4, the nitride semiconductor body 3, and the second electrode 5 illustrated in FIG. 8. In the column of the performance of Table 4, there were no numerical values out of the "0.62 or more" which considered as a good optical power output value. When both of the case of planar shapes of the first electrode layer 4, the nitride semiconductor body 3, and the second electrode layer 5 are the shapes of FIG. 12 and FIG. 8, there were no numerical values out of the range of a good forward voltage increase rate meaning "1.4 or less" for FIG. 12 and "1.5 or less" for FIG. 8.

It is found from the results of Table 5 that, in the elements of No. 3-3 to No. 3-7 having an Mg concentration of the p-type GaN layer as the p-type Group III nitride semiconductor layer 350 of $1 \times 10^{20}$ cm$^{-3}$ or more and $7.6 \times 10^{20}$ cm$^{-3}$ or less, a high optical power output of 0.97 or more is obtained at a good forward voltage increase rate meaning "1.4 or less" for FIG. 12 and "1.5 or less" for FIG. 8 of the planar shapes of the first electrode layer 4, the nitride semiconductor body 3, and the second electrode layer 5.

<Test 4: No. 4-1 to No. 4-9>

The ultraviolet light emitting elements 10A each having the structure described in the second embodiment and having the same configuration as that of the test 1 except the following points were produced. As the carrier blocking layer 330, an AlN layer having a film thickness of 10 nm was used and the Al included ratio in the contact surface 41 and in the vicinity of the contact surface 41 of the first electrode layer was set to 80% by area. Moreover, the total film thickness of the n-type Group III nitride semiconductor layer 20 and the n-type Group III nitride semiconductor layer 310 was varied and the lattice relaxation rate was varied. More specifically, the elements of No. 4-1 to No. 4-9 satisfy the Al composition x of the $Al_xGa_{(1-x)}N$ layer for the carrier blocking layer 330 of $0.90 \leq x \leq 1.00$ and the Al included ratio in the contact surface 41 and in the vicinity of the contact surface 41 of the first electrode layer of 70% by area or more.

Operation currents of 100 mA and 500 mA were applied to the obtained ultraviolet light emitting elements 10A of No. 4-1 to No. 4-9, and then the forward voltages at the currents were measured. For the measured values of the obtained forward voltages, a relative value when the forward voltage at 100 mA of the operation current was set to 1 was calculated as the forward voltage increase rate. Furthermore, 350 mA of operation current was applied to the ultraviolet light emitting element 10A to measure the optical power output was measured. As a result, light emission having a peak wavelength at around 270 nm was obtained. The relative value (value when the value of No. 1-2 was set to 1) of the optical power output as the measured value of the forward voltage is given as well as the configuration of each of the ultraviolet light emitting elements 10A of No. 4-1 to No. 4-9 in the following table 6.

TABLE 6

| No. | Configuration First Group III nitride semiconductor layer Film thickness [nm] | Lattice relaxation rate [%] | Performance Optical power output (Relative value) | Forward voltage increase rate FIG. 12 | FIG. 8 |
|---|---|---|---|---|---|
| 4-1 | 500 | 0 | 1.00 | 1.20 | 1.32 |
| 4-2 | 600 | 2 | 1.00 | 1.18 | 1.29 |
| 4-3 | 700 | 7 | 0.98 | 1.16 | 1.28 |
| 4-4 | 900 | 8 | 0.99 | 1.16 | 1.28 |
| 4-5 | 1200 | 12 | 0.97 | 1.18 | 1.29 |
| 4-6 | 1300 | 14 | 0.97 | 1.19 | 1.31 |
| 4-7 | 1450 | 17 | 0.96 | 1.26 | 1.39 |
| 4-8 | 1500 | 22 | 0.94 | 1.30 | 1.43 |
| 4-9 | 1800 | 45 | 0.66 | 1.34 | 1.48 |

It is found from the results of Table 6 that, by setting the lattice relaxation rate of the n-type Group III nitride semiconductor layer to 15% or less, a high optical power output of 0.97 or more is obtained at a low forward voltage increase rate. Particularly when the planar shapes of the first electrode layer 4, the nitride semiconductor body 3, and the second electrode layer 5 are the shapes of FIG. 12 and FIG. 8, a high optical power output of 0.97 or more is obtained at a forward voltage increase rate of "1.4 or less" for FIG. 12 and "1.5 or less" for FIG. 8.

DESCRIPTION OF REFERENCE NUMERALS 1 substrate
11 one surface of substrate
13 side surface (inclined surface) of nitride semiconductor body
2 n-type nitride semiconductor layer (first conductivity type first nitride semiconductor layer)
20 n-type Group III nitride semiconductor layer (first Group III nitride semiconductor layer)
3 nitride semiconductor body
30 nitride semiconductor body
31 n-type nitride semiconductor layer
32 nitride semiconductor light emitting layer
33 p-type nitride semiconductor layer (second conductivity type second nitride semiconductor layer)
310 n-type Group III nitride semiconductor layer (first Group III nitride semiconductor layer)
320 Group III nitride semiconductor active layer
330 carrier blocking layer
340 graded layer
350 p-type Group III nitride semiconductor layer (second Group III nitride semiconductor layer)
4 first electrode layer
4a first layer configuring first electrode layer
4b second layer configuring first electrode layer
4c third layer configuring first electrode layer
41 contact surface to n-type nitride semiconductor layer of first electrode layer
411 first region of contact surface
412 second region of contact Surface
413 third region of contact Surface
5 second electrode layer
51, 52, 53 rod like portion
54, 55 connection portion
6 first pad electrode
7 second pad electrode
8 insulating layer
10 ultraviolet light emitting element (nitride semiconductor element)
10A ultraviolet light emitting element (nitride semiconductor light emitting element)

What is claimed is:

1. A nitride semiconductor element comprising:
a substrate;
a first conductivity type first nitride semiconductor layer formed on the substrate, and
a first electrode layer formed on the first nitride semiconductor layer, wherein
the first electrode layer contains, one or more first regions and one or more second regions,
the one or more first regions and the one or more second regions contact the first nitride semiconductor layer at a contact surface,
each first region of the first electrode layer comprises an alloy containing aluminum and nickel, the alloy being present at or within 3 nm of the contact surface,
each second region of the first electrode layer comprises an aluminum substance containing aluminum but not an alloy of aluminum and nickel, the aluminum substance being present at or within 3 nm of the contact surface,
the aluminum substance of the one or more second regions does not extend over a top surface of any of the one or more first regions,
wherein a third region is disposed over one of the second regions;
a composition of the third region is different from a composition of the one or more first regions and different from a composition of the one or more second regions;
in plan view, at least one first region is surrounded by one of the second regions, and
in plan view, the at least one first region is surrounded by the third region.

2. The nitride semiconductor element according to claim 1, wherein
the first electrode comprises one or more elements selected from Ti, Mo, V, Au, W, Pt, Pd, Si, and Zr, and the one or more elements are present in at least a part of the contact surface or within 3 nm of the contact surface.

3. The nitride semiconductor element according to claim 1, wherein
the first electrode comprises Ti or Au, and the Ti or Au is present in at least a part of the contact surface or within 3 nm of the contact surface.

4. The nitride semiconductor element according to claim 1, wherein
the first electrode comprises Ti, and the Ti is present in at least a part of the contact surface.

5. The nitride semiconductor element according to claim 1, wherein
a total existence ratio of the aluminum substance and the alloy containing aluminum and nickel at or within 3 nm of the contact surface is 60% by area or more of a total contact area between the first electrode layer and the first nitride semiconductor layer, and
at or within 3 nm of the contact surface, a ratio of an area of the one or more second regions to a total area of the one or more first regions and the one or more second regions is 30% or more.

6. The nitride semiconductor element according to claim 5, wherein
a thickness of the aluminum substance is 1 nm or more and 150 nm or less.

7. The nitride semiconductor element according to claim 5, wherein
a thickness of the aluminum substance is 1 nm or more and 100 nm or less.

8. The nitride semiconductor element according to claim 5, wherein
a thickness of the alloy containing aluminum and nickel is 100 nm or more and 1000 nm or less.

9. The nitride semiconductor element according to claim 5, wherein
a thickness of the alloy containing aluminum and nickel is 100 nm or more and 600 nm or less.

10. The nitride semiconductor element according to claim 5, wherein
an area ratio of the alloy containing aluminum and nickel to the aluminum substance is 1:2 to 400:1 in a cross section perpendicular to the substrate and along a straight line passing through a center of the substrate and extending from one end to another end of the substrate as viewed in plan.

11. The nitride semiconductor element according to claim 5, wherein
an area ratio of the alloy containing aluminum and nickel to the aluminum substance is 2:35 to 400:1 in a cross section perpendicular to the substrate and along a straight line passing through a center of the substrate and extending from one end to another end of the substrate as viewed in plan.

12. The nitride semiconductor element according to claim 1, wherein
   a total existence ratio of the aluminum substance and the alloy containing aluminum and nickel at or within 3 nm of the contact surface is 70% by area or more of a total contact area between the first electrode layer and the first nitride semiconductor layer, and
   at or within 3 nm of the contact surface, a ratio of an area of the one or more second regions to a total area of the one or more first regions and the one or more second regions is 30% or more.

13. The nitride semiconductor element according to claim 1, wherein
   the first nitride semiconductor layer contains $Al_xGa_{(1-x)}N$ (0≤x≤1).

14. A nitride semiconductor light emitting element contained in the nitride semiconductor element according to claim 1, wherein
   the first nitride semiconductor layer is a first Group III nitride semiconductor containing at least aluminum (Al) and gallium (Ga), the nitride semiconductor light emitting element further comprising:
   a nitride semiconductor body formed in a part on the first Group III nitride semiconductor layer and containing a Group III nitride semiconductor active containing at least aluminum (Al) and gallium (Ga), a carrier blocking layer as an $Al_xGa_{(1-x)}N(0.90≤x≤1.00)$ layer, and a second Group III nitride semiconductor layer in this order from a side of the substrate, and a second electrode layer formed on the second Group III nitride semiconductor layer.

15. The nitride semiconductor light emitting element according to claim 14, wherein
   a film thickness of the carrier blocking layer is 5 nm or more and 18 nm or less.

16. The nitride semiconductor light emitting element according to claim 14 further comprising:
   a graded layer as an $Al_yGa_{(1-y)}N$ (0.00≤y≤1.00) layer disposed between the carrier blocking layer and the second Group III nitride semiconductor layer having an Al composition y decreasing from a surface in contact with the carrier blocking layer toward a surface in contact with the second Group III nitride semiconductor layer.

17. The nitride semiconductor light emitting element according to claim 16, wherein
   a film thickness of the graded layer is 5 nm or more and 110 nm or less.

18. The nitride semiconductor light emitting element according to claim 14, wherein
   the second Group III nitride semiconductor layer is a GaN containing Mg as an impurity in a range of $1×10^{20}$ $cm^{-3}$ or more and less than $8×10^{20}$ $cm^{-3}$.

19. The nitride semiconductor light emitting element according to claim 14, wherein
   a film thickness of the second Group III nitride semiconductor layer is 5 nm or more and 100 nm or less.

20. The nitride semiconductor light emitting element according to claim 14, wherein
   a lattice relaxation rate of the first Group III nitride semiconductor layer is 0% or more and 15% or less.

21. The nitride semiconductor light emitting element according to claim 14, wherein
   the substrate is an AlN substrate.

22. An ultraviolet light emitting element contained in the nitride semiconductor light emitting element according to claim 14, wherein
   the Group III nitride semiconductor active layer emits ultraviolet light with a wavelength of 300 nm or less.

23. An ultraviolet light emitting element contained in the nitride semiconductor element according to claim 1, the ultraviolet light emitting element comprising:
   a nitride semiconductor body formed in a part on the first nitride semiconductor layer and containing a second conductivity type second nitride semiconductor layer; and
   a second electrode layer formed on the second nitride semiconductor layer of the nitride semiconductor body, wherein
   the nitride semiconductor body contains a nitride semiconductor light emitting layer on a side of the first nitride semiconductor layer relative to the second nitride semiconductor layer, and
   the nitride semiconductor light emitting layer emits ultraviolet light with a wavelength of 300 nm or less.

24. The nitride semiconductor element according to claim 1, wherein
   in plan view, each first region is surrounded by one of the second regions.

25. The nitride semiconductor element according to claim 1, wherein
   a thickness of the at least one first region is 100 nm or more and 1000 nm or less.

26. The nitride semiconductor element according to claim 1, wherein
   a thickness of the one of the second regions surrounding the at least one first region is 1 nm or more and 150 nm or less.

27. The nitride semiconductor element according to claim 1, wherein
   a thickness of the at least one first region is greater than a thickness of the one of the second regions surrounding the at least one first region.

28. The nitride semiconductor element according to claim 1, wherein a thickness of the third region is less than a thickness of the at least one first region.

29. The nitride semiconductor element according to claim 1, wherein a thickness of the third region is greater than a thickness of the one of the second regions.

30. The nitride semiconductor element according to claim 1, wherein
   in plan view, a perimeter of the at least one first region is rounded.

* * * * *